United States Patent
Shimojo

(10) Patent No.: US 9,947,683 B2
(45) Date of Patent: Apr. 17, 2018

(54) THREE-DIMENSIONAL SEMICONDUCTOR MEMORY DEVICE AND METHOD FOR MANUFACTURING THE SAME

(71) Applicant: TOSHIBA MEMORY CORPORATION, Minato-ku (JP)

(72) Inventor: Yoshiro Shimojo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 29 days.

(21) Appl. No.: 15/013,153

(22) Filed: Feb. 2, 2016

(65) Prior Publication Data
US 2017/0077124 A1 Mar. 16, 2017

Related U.S. Application Data

(60) Provisional application No. 62/217,457, filed on Sep. 11, 2015.

(51) Int. Cl.
*H01L 27/11582* (2017.01)
*H01L 21/768* (2006.01)
*H01L 29/792* (2006.01)

(52) U.S. Cl.
CPC .. *H01L 27/11582* (2013.01); *H01L 21/76802* (2013.01); *H01L 21/76831* (2013.01); *H01L 21/76877* (2013.01); *H01L 29/7926* (2013.01)

(58) Field of Classification Search
CPC ........... H01L 27/11582; H01L 27/1157; H01L 27/11524; H01L 29/7926; H01L 21/76802; H01L 21/76831; H01L 21/76877
See application file for complete search history.

(56) References Cited

U.S. PATENT DOCUMENTS

| 9,793,291 B2* | 10/2017 | Shin | H01L 27/11582 |
| 2010/0181612 A1* | 7/2010 | Kito | H01L 27/11551 257/319 |
| 2011/0156132 A1* | 6/2011 | Kiyotoshi | H01L 27/11575 257/326 |
| 2012/0206961 A1* | 8/2012 | Kito | G11C 16/0483 365/185.2 |

(Continued)

OTHER PUBLICATIONS

U.S. Appl. No. 14/657,235, filed Mar. 13, 2015, Yoshiro Shimojo, et al.

*Primary Examiner* — Marcos D Pizarro
*Assistant Examiner* — Shannon Yi
(74) *Attorney, Agent, or Firm* — Oblon, McClelland, Maier & Neustadt, L.L.P.

(57) ABSTRACT

According to one embodiment, a semiconductor memory device includes a structural body, first to fourth pillars, a first interconnection, a second interconnection, a third interconnection, and a fourth interconnection. The first to fourth pillars are provided within the structural body extending along the first direction. A first distance between the first pillar and the first interconnection is greater than a second distance between the third pillar and the third interconnection. The first distance is greater than a third distance between the fourth pillar and the fourth interconnection. A fourth distance between the second pillar and the second interconnection is greater than the second distance. The fourth distance is greater than the third distance.

17 Claims, 21 Drawing Sheets

(56) References Cited

U.S. PATENT DOCUMENTS

| | | | | |
|---|---|---|---|---|
| 2013/0113080 A1* | 5/2013 | Hioka | ............... | H01L 27/11582 |
| | | | | 257/532 |
| 2013/0270621 A1* | 10/2013 | Mori | ....................... | H01L 29/78 |
| | | | | 257/314 |
| 2014/0085976 A1* | 3/2014 | Fujiki | .................... | G11C 16/04 |
| | | | | 365/185.05 |
| 2015/0115345 A1* | 4/2015 | Nowak | ............. | H01L 27/11582 |
| | | | | 257/314 |
| 2015/0287706 A1* | 10/2015 | Sukekawa | ............... | H01L 25/18 |
| | | | | 257/390 |

\* cited by examiner

THREE-DIMENSIONAL SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/217,457, filed on Sep. 11, 2015; the entire contents of which are incorporated herein by reference.

FIELD

Embodiments described herein relate generally to a semiconductor memory device and a method for manufacturing the same.

BACKGROUND

In recent years, 3-dimension stacked semiconductor memory devices have been proposed in which memory cells are integrated in 3-dimensions. There is a demand for even higher levels of integration in 3-dimension stacked semiconductor memory devices.

DETAILED DESCRIPTION

Figure 1A:
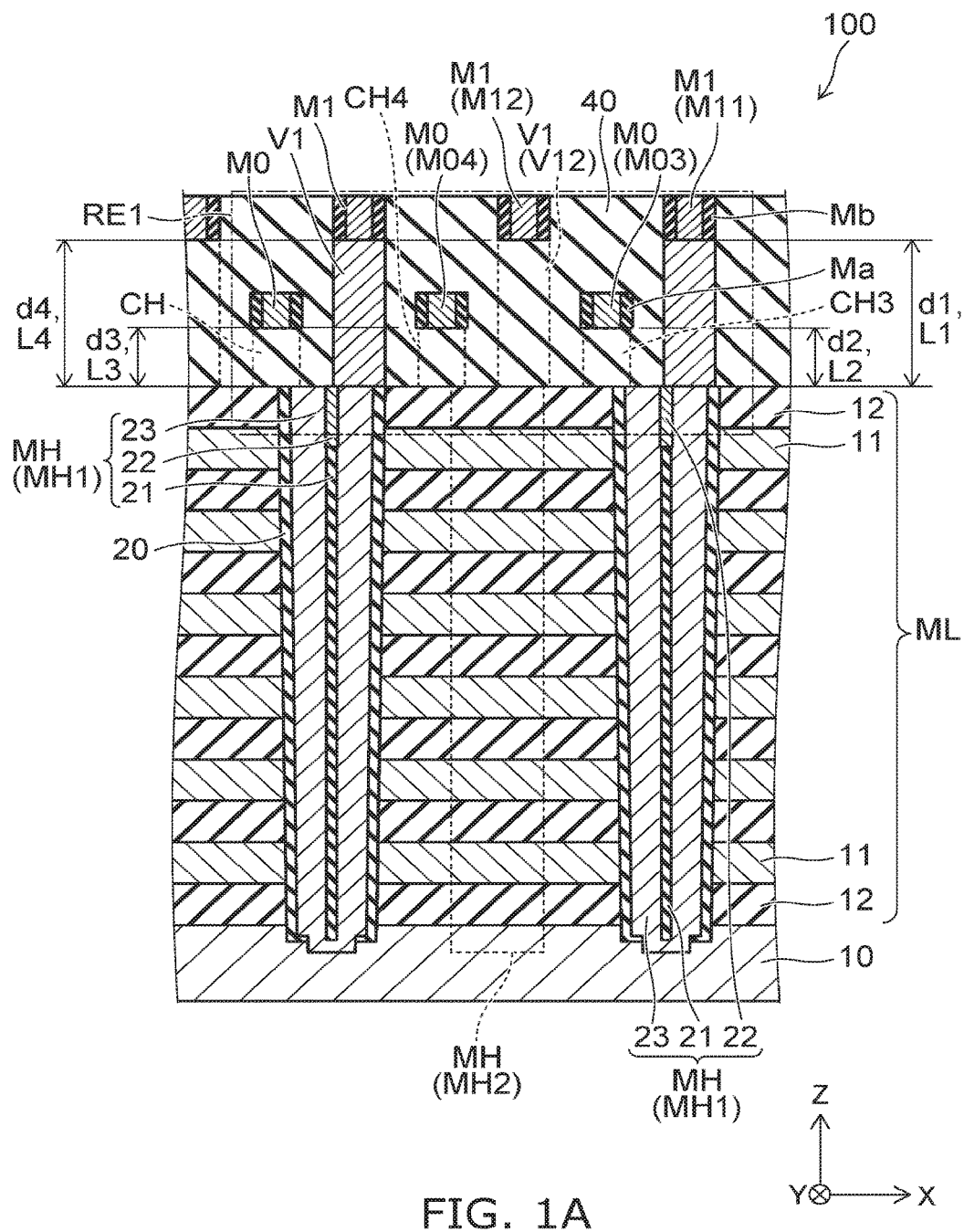
FIGS. 1A to 1D are cross-sectional views illustrating a semiconductor memory device according to a first embodiment.

According to one embodiment, a semiconductor memory device includes a structural body, first to fourth pillars, a first interconnection, a second interconnection, a third interconnection, and a fourth interconnection. The first to fourth pillars are provided within the structural body extending along the first direction. A first distance between the first pillar and the first interconnection is greater than a second distance between the third pillar and the third interconnection. The first distance is greater than a third distance between the fourth pillar and the fourth interconnection. A fourth distance between the second pillar and the second interconnection is greater than the second distance. The fourth distance is greater than the third distance.

Hereinafter, embodiments of the invention will be described below with reference to the drawings.

Note that the drawings are schematic or conceptual and that relationships between thicknesses and widths of parts and proportions in size between parts may differ from actual parts. Also, even where identical parts are depicted, mutual dimensions and proportions may be illustrated differently depending on the drawing. Note that in the drawings and specification of this application, the same numerals are applied to constituents that have already appeared in the drawings and have been described, and repetitious detailed descriptions of such constituents are omitted.

(First Embodiment)

FIGS. 1A to 1D are cross-sectional views illustrating a semiconductor memory device according to the embodiment.

Figure 2:
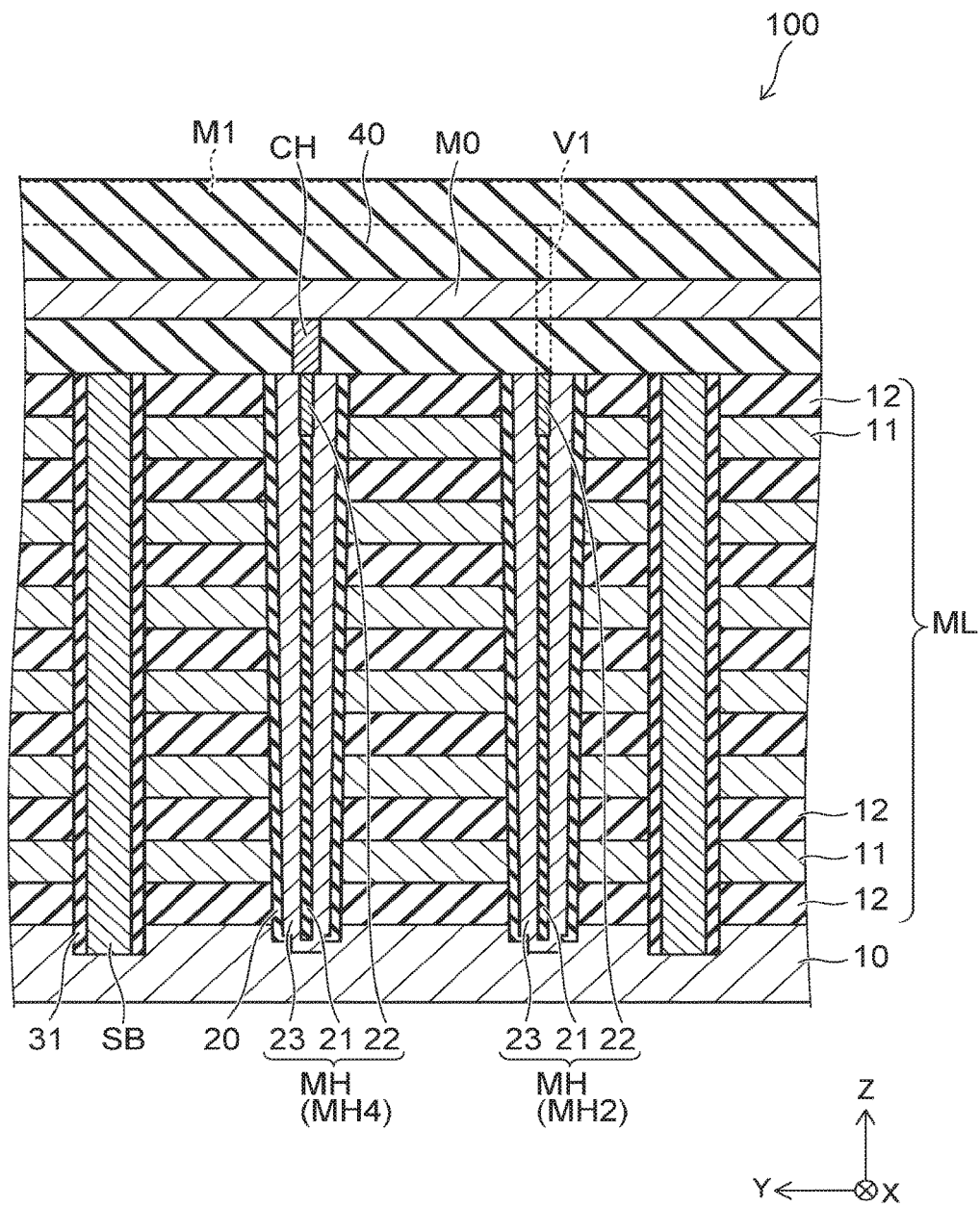
FIG. 2 is a cross-sectional view illustrating the semiconductor memory device according to the first embodiment.

FIG. 2 is a cross-sectional view illustrating the semiconductor memory device according to the embodiment.

Figure 3:
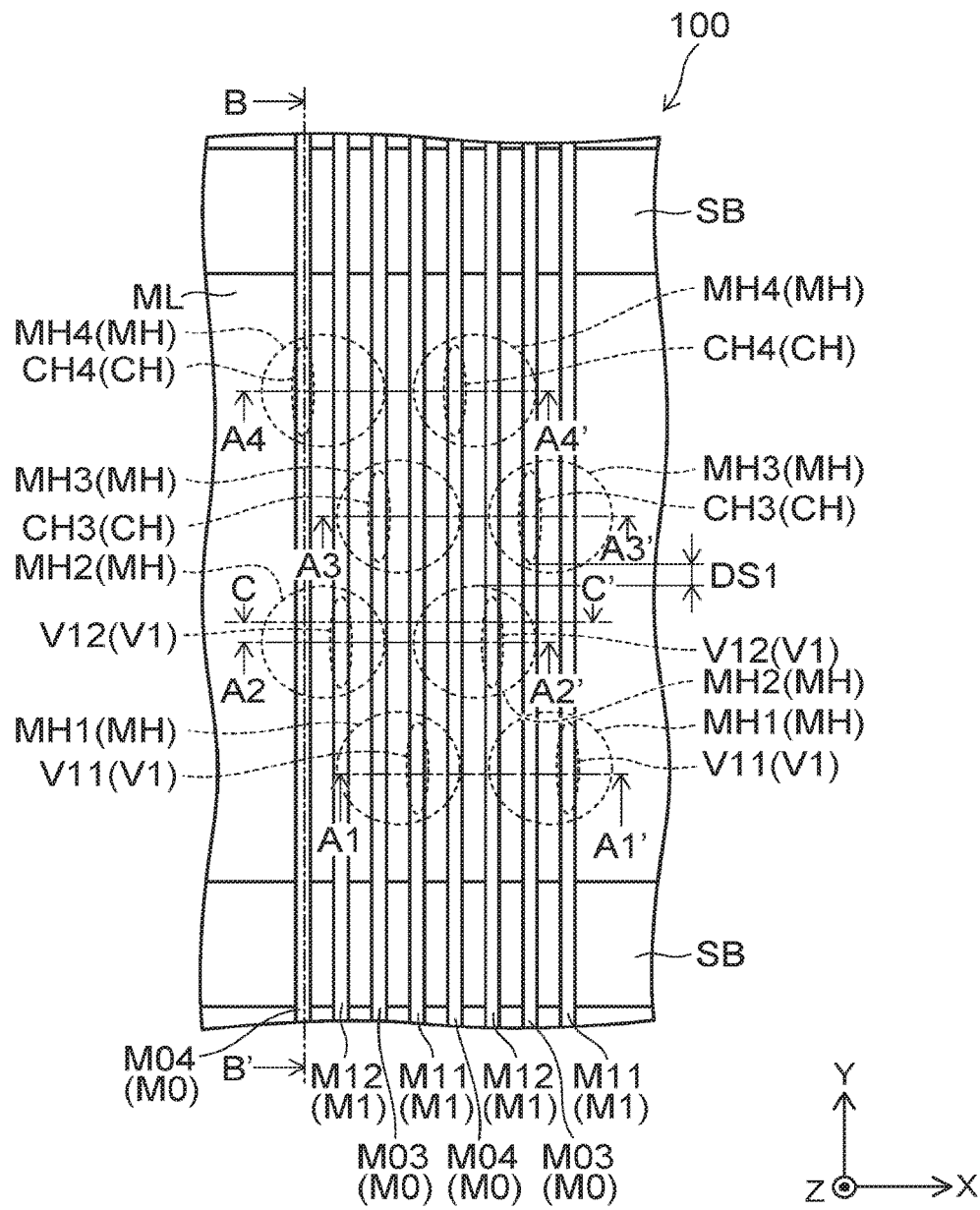
FIG. 3 is a plan view illustrating the semiconductor memory device according to the first embodiment.

FIG. 3 is a plan view illustrating the semiconductor memory device according to the embodiment.

Figure 1B:
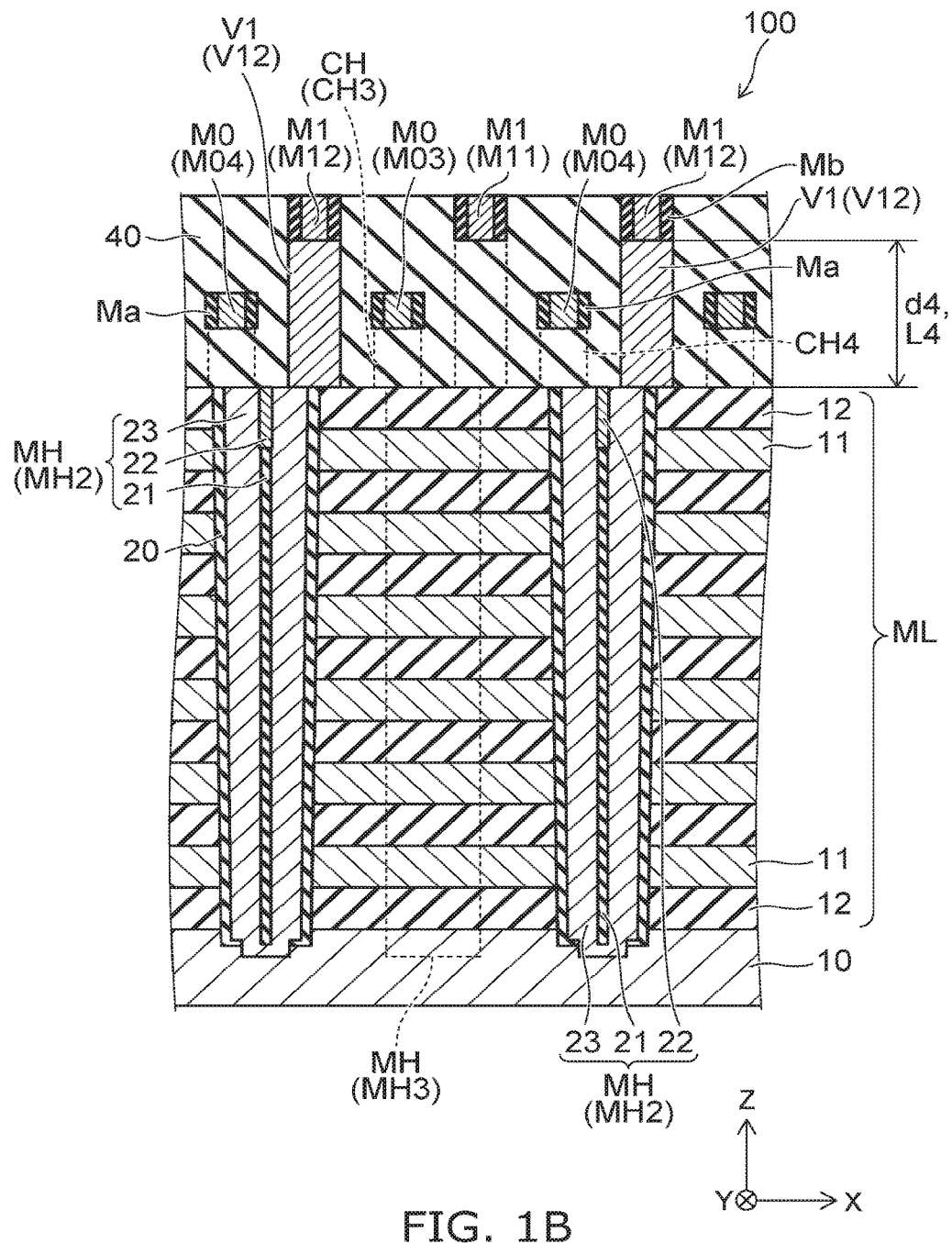
Figure 1C:
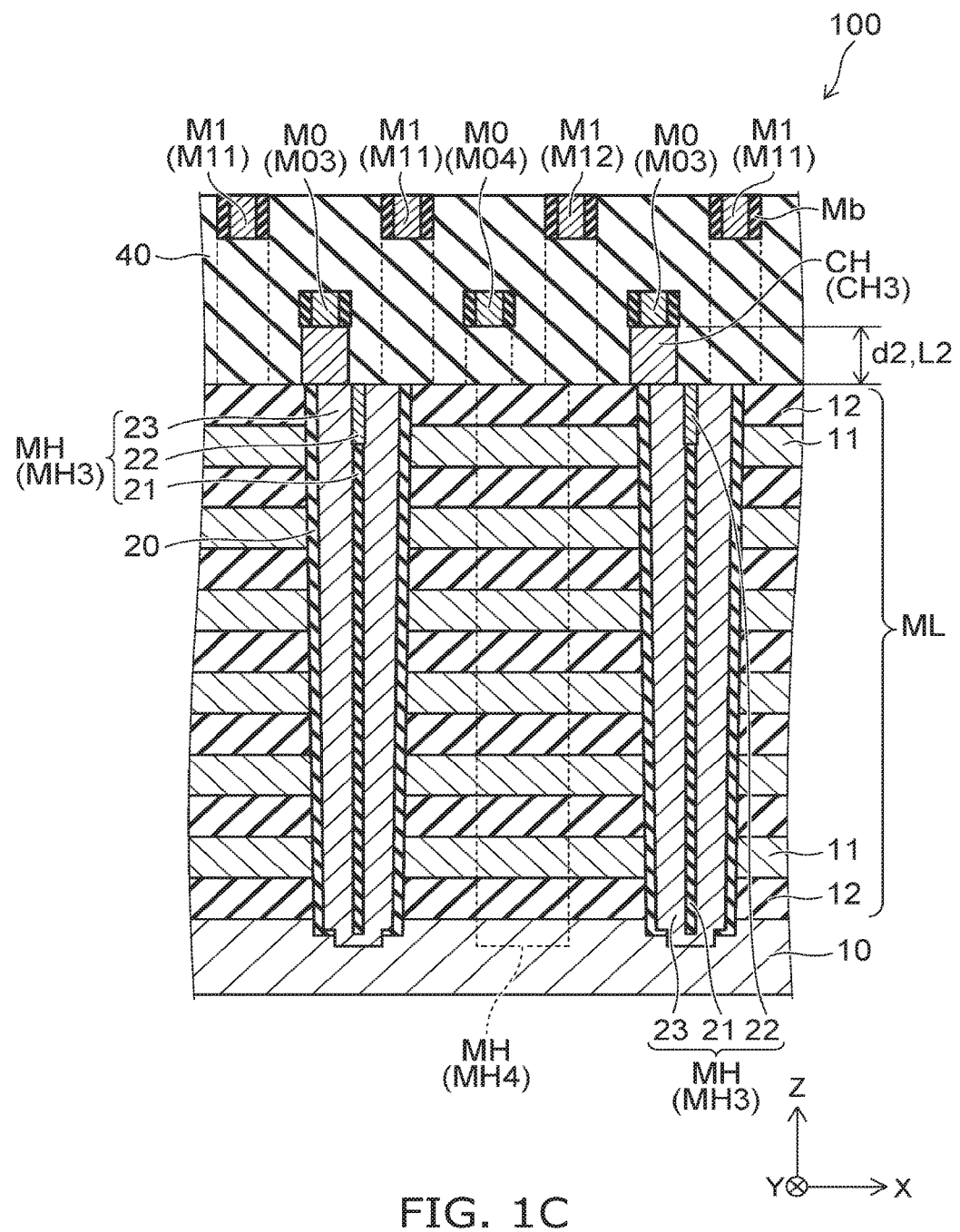
Figure 1D:
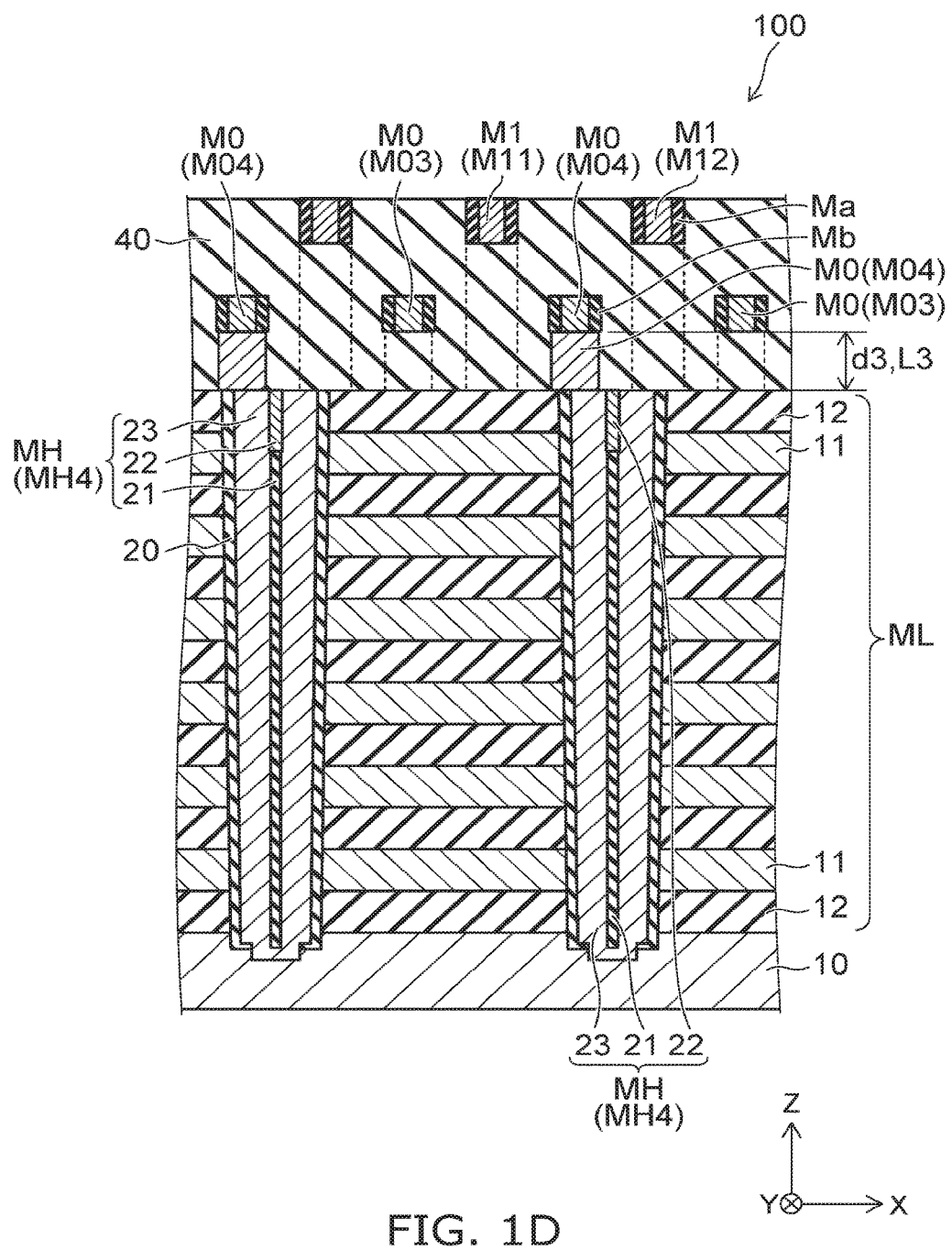

FIG. 1A is a schematic cross-sectional view at the line A1-A1' in FIG. 3, FIG. 1B is a schematic cross-sectional view at the line A2-A2' in FIG. 3, FIG. 1C is a schematic cross-sectional view at the line A3-A3' in FIG. 3, and FIG. 1D is a schematic cross-sectional view at the line A4-A4' in FIG. 3. FIG. 2 is a schematic cross-sectional view at the line B-B' in FIG. 3.

As illustrated in FIG. 1A, a substrate 10 is provided in a semiconductor memory device 100 according to the embodiment. A stacked body ML (structural body) that includes a plurality of electrode layers 11 disposed in the Z-direction is provided on the substrate 10. In the stacked body ML, an insulating member is provided between each of the electrode layers 11. The insulating member is, for example, an insulating layer 12. The insulating member may be an air gap.

A plurality of pillars MH is provided within the stacked body ML. Each of the pillars MH extends along a direction perpendicular to a main surface of the substrate 10. The direction along which the pillars MH extend is referred to as the Z-direction (first direction). One direction orthogonal to the Z-direction is referred to as the Y-direction (second direction). The direction orthogonal to the Z-direction and the Y-direction is referred to as the X-direction (third direction). The plurality of pillars MH is electrically connected to the substrate 10.

A memory film 20 is provided between each of the pillars MH and the stacked body ML. The memory film 20 has, for example, a block insulating film, a charge storage film, and a tunnel insulating film. The block insulating film is provided between the stacked body ML and each of the pillars MH. The tunnel insulating film is provided between the block insulating film and each of the pillars MH. The charge storage film is provided between the block insulating film and the tunnel insulating film.

The block insulating film is a film through which a current does not substantially flow even when a voltage within the range of the driving voltage of the semiconductor memory device 100 is applied. The charge storage film is a film with the capability of storing charge. The tunnel insulating film is normally an insulating film. However, when a predetermined voltage within the range of the driving voltage of the semiconductor memory device 100 is applied, a tunnel current flows through the tunnel insulating film.

The tunnel insulating film and the block insulating film include, for example, silicon oxide. The tunnel insulating film and the block insulating film may include, for example, $Al_2O_3$, $Y_2O_2$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO. The charge storage film is formed from, for example, silicon nitride.

The pillars MH include a core insulating member 21, a diffusion layer 22, and a semiconductor layer 23. The core insulating member 21 has a substantially circular cylindrical shape extending in the Z-direction. The diffusion layer 22 is provided on the core insulating member 21. The semiconductor layer 23 is provided between the diffusion layer 22 and the memory film 20, between the core insulating member 21 and the memory film 20, and between the core insulating member 21 and the substrate 10.

As illustrated in FIG. 2, a plurality of source members SB is provided within the stacked body ML. The source members SB have a plate-like shape extending in the Z-X plane. In other words, the width in the Z-direction of the source members SB is greater than the width in the Y-direction of the source members SB. The width in the X-direction of the source members SB is greater than the width in the Y-direction of the source members SB. The source members SB are electrically connected to the substrate 10. An insulating film 31 is provided between the stacked body ML and the source members SB. An insulating film 40 is provided on the stacked body ML.

As illustrated in FIGS. 1A to 1C and FIG. 2, a plurality of lower bit lines M0 extending in the Y-direction and a plurality of upper bit lines M1 extending in the Y-direction are provided within the insulating film 40. Although described in detail later, in the Z-direction, the distance between the uppermost layer of the stacked body ML and the plurality of upper bit lines M1 is greater than the distance between the uppermost layer of the stacked body ML and the plurality of lower bit lines M0. Each of the pillars MH of a first portion of the plurality of pillars MH is electrically connected to the upper bit line M1. Each of the pillars MH of a second portion of the plurality of pillars MH is electrically connected to the lower bit line M0.

As illustrated in FIGS. 1A and 1B, a plug V1 is provided between one upper bit line M1 and the pillar MH that is electrically connected to that upper bit line M1. In other words, that upper bit line M1 and the pillar MH are electrically connected via the plug V1.

As illustrated in FIGS. 1C and 1D, a plug CH is provided between one lower bit line M0 and the pillar MH that is electrically connected to that lower bit line M0. In other words, that lower bit line M0 and the pillar MH are electrically connected via the plug CH.

In the X-direction, an insulating film Ma (first side wall insulating film) may be provided between the lower bit line M0 and the insulating film 40. In the X-direction, an insulating film Mb (second side wall insulating film) may be provided between the upper bit line M1 and the insulating film 40.

In the X-direction, the distance between the two lower bit lines M0 that are closest to each other is, for example, about 78 nm. In the X-direction, the distance between the two upper bit lines M1 that are closest to each other is, for example, about 78 nm. The length in the Y-direction of the lower bit lines M0 is, for example, about 19.5 nm. The length in the X-direction of the upper bit lines M1 is, for example, about 19.5 nm.

As illustrated in FIG. 3, the pillars MH are disposed in, for example, a matrix form in the X-Y plane. For example, the pillars MH are disposed staggered. In other words, between a row of a plurality of pillars MH disposed in the X-direction and an adjacent row, the positions of the pillars MH are shifted relative to each other in the X-direction. Note that in FIG. 3, configuration elements apart from the pillars MH, the stacked body ML, the upper bit lines M1, the lower bit lines M0, and the plugs V1 are omitted.

The plurality of pillars MH are disposed, for example, in four rows in the Y-direction, between two source members SB that are adjacent to each other in the Y-direction. Here, in the order from the front side in the Y-direction, the first row of pillars MH disposed along the X-direction is referred to as the first pillars MH1, the second row of pillars MH disposed along the X-direction is referred to as the second pillars MH2, the third row of pillars MH disposed along the X-direction is referred to as the third pillars MH3, and the fourth row of pillars MH disposed along the X-direction is referred to as the fourth pillars MH4.

In the X-direction, the plurality of upper bit lines M1 and the plurality of lower bit lines M0 are provided alternately and separated from each other.

The plurality of upper bit lines M1 includes a first upper bit line M11 (first line) and a second upper bit line M12 (second line). The plurality of lower bit lines M0 includes a first lower bit line M03 (third line) and a second lower bit line M04 (fourth line).

For example, the first upper bit line M11, the first lower bit line M03, the second upper bit line M12, and the second lower bit line M04 are provided in that order from the X-direction side in the upper bit lines M1 and the lower bit lines M0.

For example, the plurality of upper bit lines M1 and the plurality of lower bit lines M0 are disposed as a single repeating unit in this order (the first upper bit line M11, the first lower bit line M03, the second upper bit line M12, and the second lower bit line M04).

The first upper bit line M11 and the first pillar MH1 are electrically connected. A first plug V11 (first conducting member) is provided between the first upper bit line M11 and the first pillar MH1 as the plug V1.

The first lower bit line M03 and the third pillar MH3 are electrically connected. A third plug CH3 (third conducting member) is provided between the first lower bit line M03 and the third pillar MH3 as the plug CH.

The second upper bit line M12 and the second pillar MH2 are electrically connected. A second plug V12 (second conducting member) is provided between the second upper bit line M12 and the second pillar MH2 as the plug V1.

The second lower bit line M04 and the fourth pillar MH4 are electrically connected. A fourth plug CH4 (fourth conducting member) is provided between the second lower bit line M04 and the fourth pillar MH4 as the plug CH.

As illustrated in FIGS. 1A to 1D, a first distance d1 between the first upper bit line M11 and the first pillar MH1 is greater than a second distance d2 between the first lower bit line M03 and the third pillar MH3. The first distance d1 is greater than a third distance d3 between the second lower bit line M04 and the fourth pillar MH4.

A fourth distance d4 between the second upper bit line M12 and the second pillar MH2 is greater than the second distance d2 between the first lower bit line M03 and the third pillar MH3. The fourth distance d4 is greater than the third distance d3 between the second lower bit line M04 and the fourth pillar MH4.

As illustrated in FIGS. 1A to 1D, the length in the Z-direction of the plug V1 (first plug V11, second plug V12) is greater than the length in the Z-direction of the plug CH (third plug CH3, fourth plug CH4).

In other words, the length L1 in the Z-direction of the first plug V11 is greater than the length L2 in the Z-direction of the third plug CH3, and the length L3 in the Z-direction of the fourth plug CH4. The length L4 in the Z-direction of the second plug V12 is greater than the length L2 in the Z-direction of the third plug CH3, and the length L3 in the Z-direction of the fourth plug CH4.

The plug V1 and the plug CH have a substantially elliptical cylindrical shape, for example. For example, the length in the X-direction of the plug V1 is smaller than the length in the Y-direction of the plug V1. For example, the length in the X-direction of the plug CH is smaller than the length in the Y-direction of the plug CH.

The following is a description of a method of manufacturing the embodiment.

Figure 4:
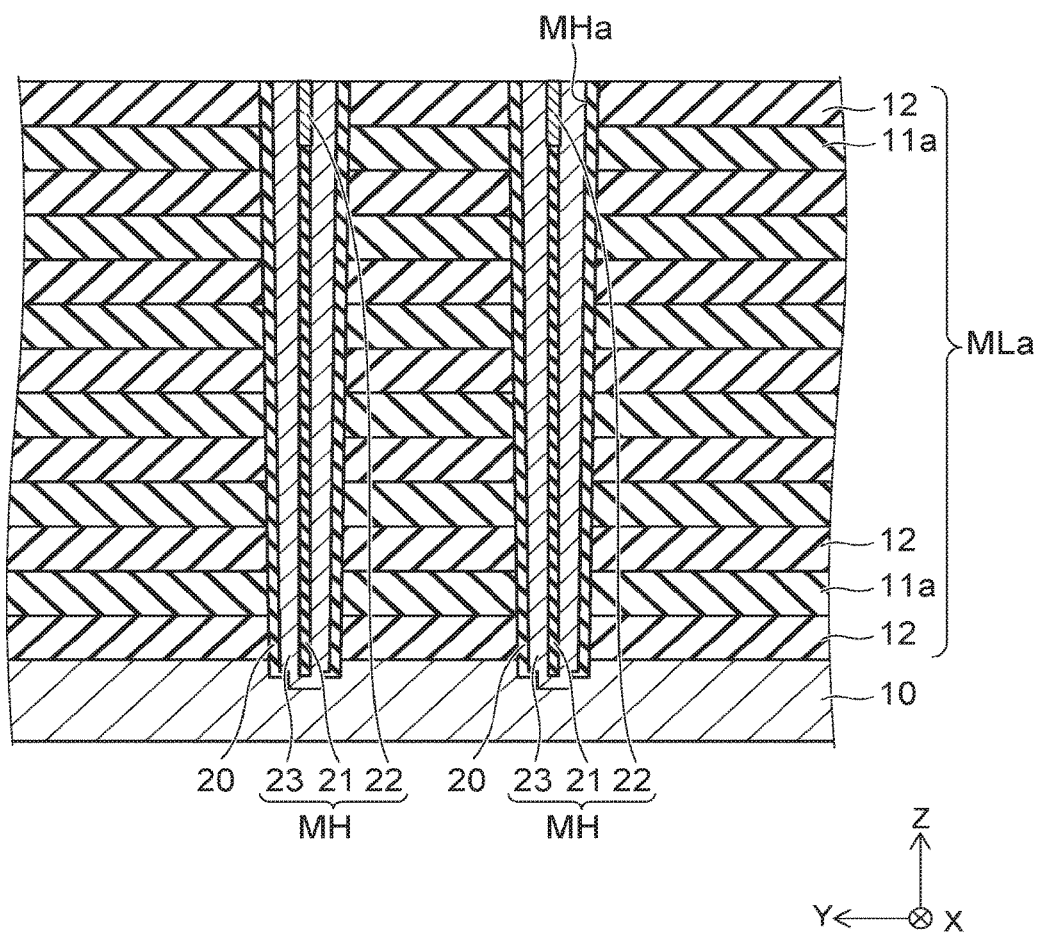
FIGS. 4 and 5 are process cross-sectional views illustrating an example of the method of manufacturing the semiconductor memory device according to the first embodiment.
Figure 5:
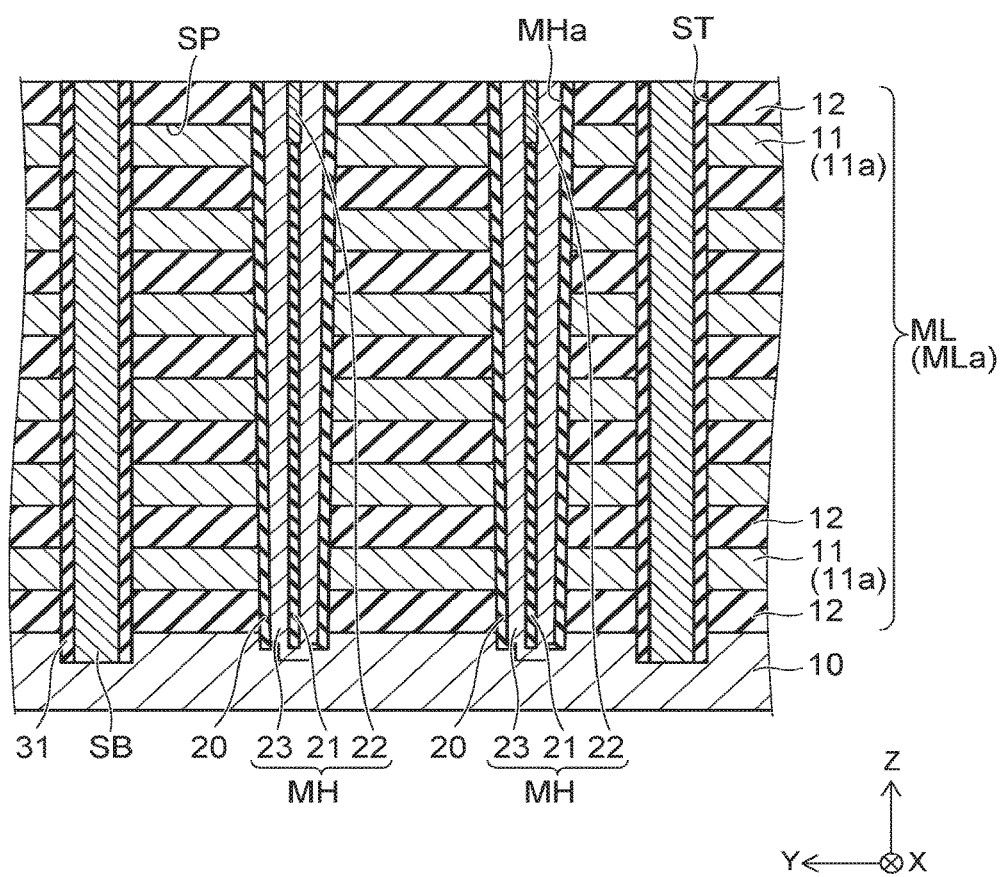

FIGS. 4 and 5 are process cross-sectional views illustrating an example of the method of manufacturing the semiconductor memory device according to the embodiment.

Figure 6:
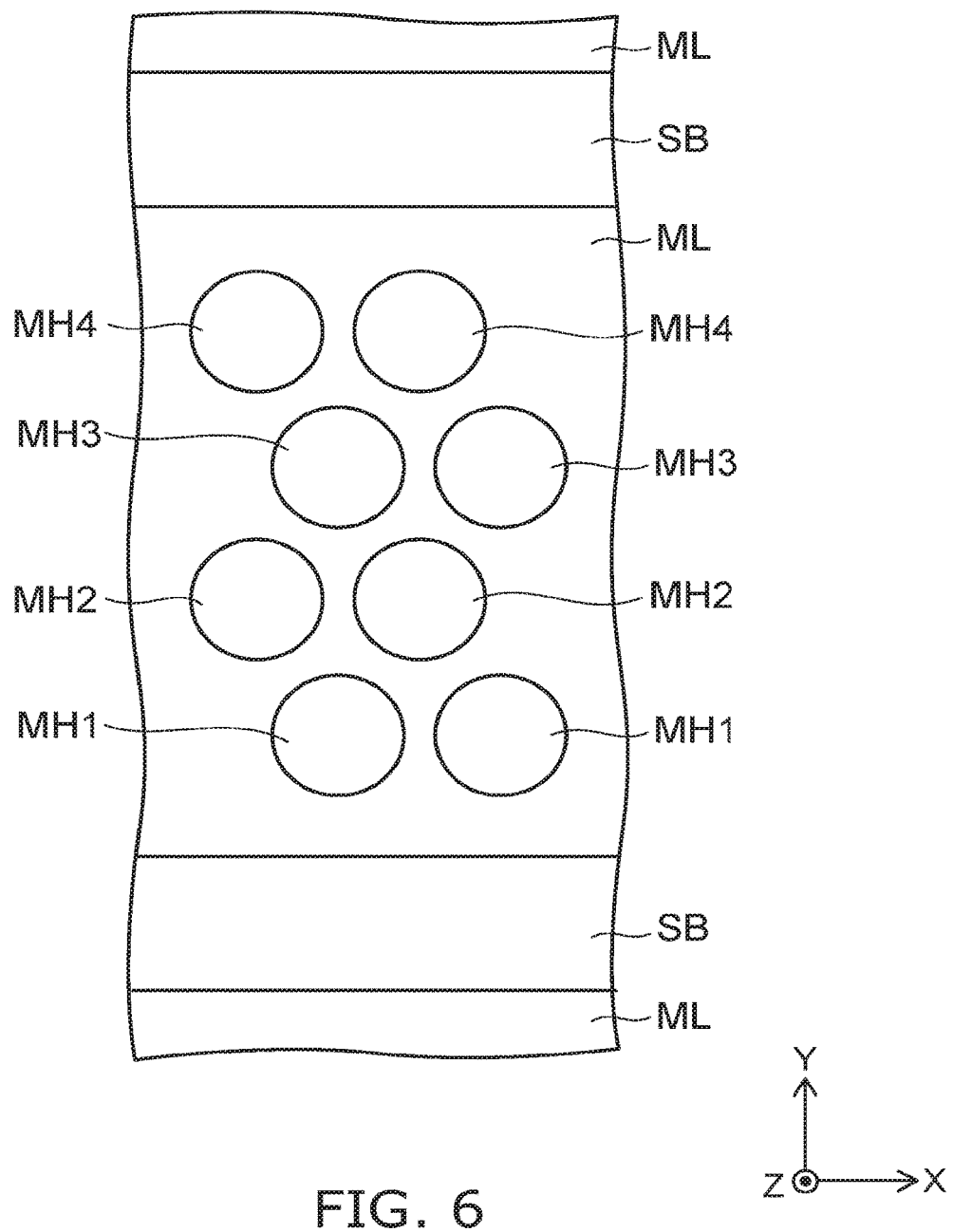
FIG. 6 is a plan view illustrating a method of manufacturing the semiconductor memory device according to the first embodiment.

FIG. 6 is a plan view illustrating a method of manufacturing the semiconductor memory device according to the embodiment.

FIGS. 7 to 13 are process cross-sectional views illustrating an example of the method of manufacturing the semiconductor memory device according to the embodiment.

FIGS. 7 to 13 are process cross-sectional views illustrating the region corresponding to the region RE1 illustrated in FIG. 1A.

As illustrated in FIG. 4, a stacked body MLa including a plurality of first layers 11a and the plurality of insulating layers 12 is formed in the Z-direction on the substrate 10. The first layers 11a are formed from, for example, a material that includes silicon nitride. The insulating layer 12 is formed from, for example, a material that includes silicon oxide. A plurality of memory holes MHa is formed in the stacked body MLa by anisotropic etching such as reactive ion etching (RIE). The memory holes MHa are substantially circular cylindrical holes extending in the Z-direction.

The memory film 20 is formed on the inner wall of the memory holes MHa. The semiconductor layer 23 is formed on the inside of the memory film 20 within the memory holes MHa. The memory film 20 and the semiconductor layer 23 formed on the bottom of the memory holes MHa are removed by anisotropic etching such as RIE. In this way, the bottoms of the memory holes MHa are exposed in a portion of the surface of the substrate 10. At this time, the memory film 20 formed on the side wall of the memory holes MHa and the semiconductor layer 23 formed on the inside of the memory film 20 remain.

A semiconductor layer is formed within the memory holes MHa. The semiconductor layer is a portion of the semiconductor layer 23. In this way, the semiconductor layer 23 is in contact with the exposed face of the substrate 10 within the memory holes MHa. In this way, the semiconductor layer 23 is electrically connected to the substrate 10.

The core insulating member 21 is formed on the inside of the semiconductor layer 23 within the memory holes MHa. Then, the top portion of the core insulating member 21 is etched. The diffusion layer 22 is formed in the cavity formed by this etching. In this way, the pillar MH is formed within the memory holes MHa. A plurality of pillars MH is formed within the stacked body ML.

As illustrated in FIG. 5, a slit ST is formed passing through the stacked body MLa. The slit has, for example, a groove shape extending along the X-Z plane. In other words, the width in the X-direction of the slit ST is greater than the width in the Y-direction of the slit ST. The width in the Z-direction of the slit ST is also greater than the width in the Y-direction of the slit ST. The first layer 11a is removed by etching via the slit ST. The portion where the first layer 11a is removed forms a gap SP. A conductive material such as tungsten, for example, is deposited within the gap SP via the slit ST. In this way, the electrode layer 11 is formed in the gap SP. In this way, the stacked body MLa becomes the stacked body ML.

As illustrated in FIG. 6, the plurality of pillars MH is formed in, for example, a matrix form in the X-Y plane. The plurality of pillars MH is formed in four rows in the Y-direction, between two source members SB that are adjacent to each other in the X-direction.

Here, the first pillar MH disposed along the X-direction is the first pillar MH1. The second pillar MH disposed along the X-direction is the second pillar MH2. The third pillar MH disposed along the X-direction is the third pillar MI3. The fourth pillar MH disposed along the X-direction is the fourth pillar MH4.

Figure 7:
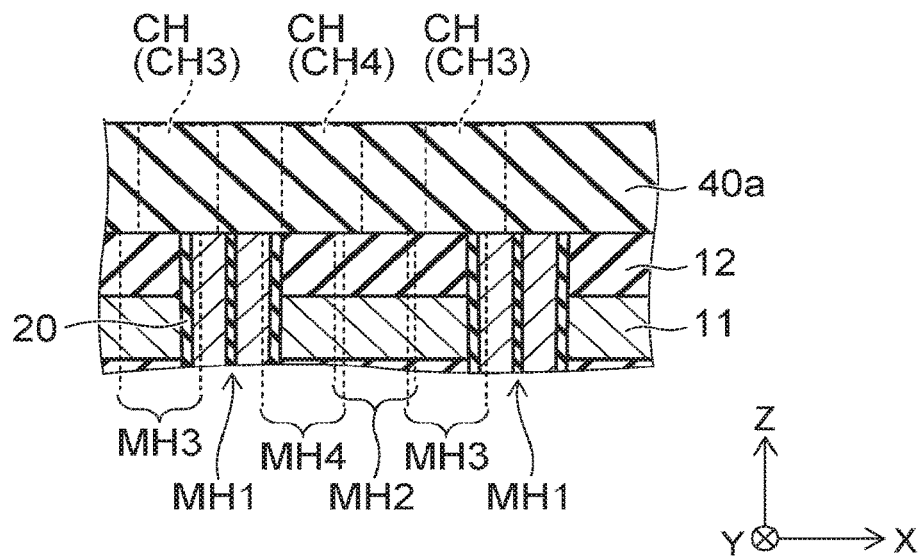
FIGS. 7 to 13 are process cross-sectional views illustrating an example of the method of manufacturing the semiconductor memory device according to the first embodiment.

As illustrated in FIG. 7, an insulating film 40a (first insulating film) is formed on the stacked body ML. A hole is formed passing through the insulating film 40a directly above the third pillar MH3 and the fourth pillar MH4. The plug CH is formed within the hole. In this way, the third plug CH3 (third conductive member) is formed directly above the third pillar MH3. The fourth plug CH4 (fourth conductive member) is formed directly above the fourth pillar MH4.

Figure 8:
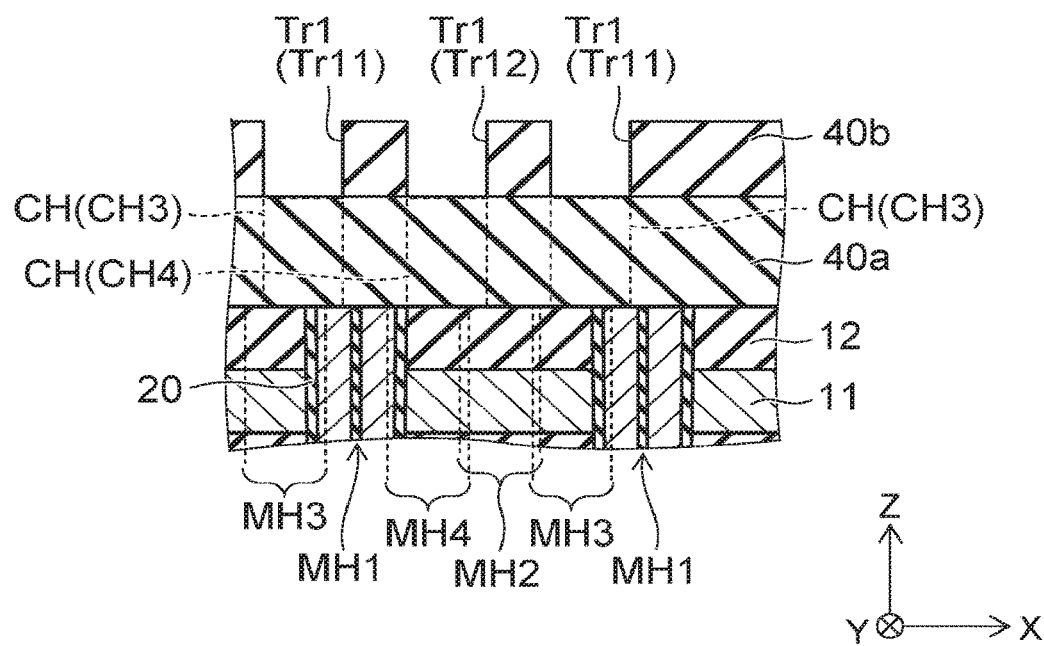

As illustrated in FIG. 8, an insulating film 40b (second insulating film) is formed on the insulating film 40a. A trench Tr1 extending in the X-direction is formed in a region that includes directly above the plug CH of the insulating film 40b, using a processing technology such as photolithography. In this way, a first trench Tr11 is formed directly above the third plug CH3. A second trench Tr12 is formed directly above the fourth plug CH4.

Figure 9:
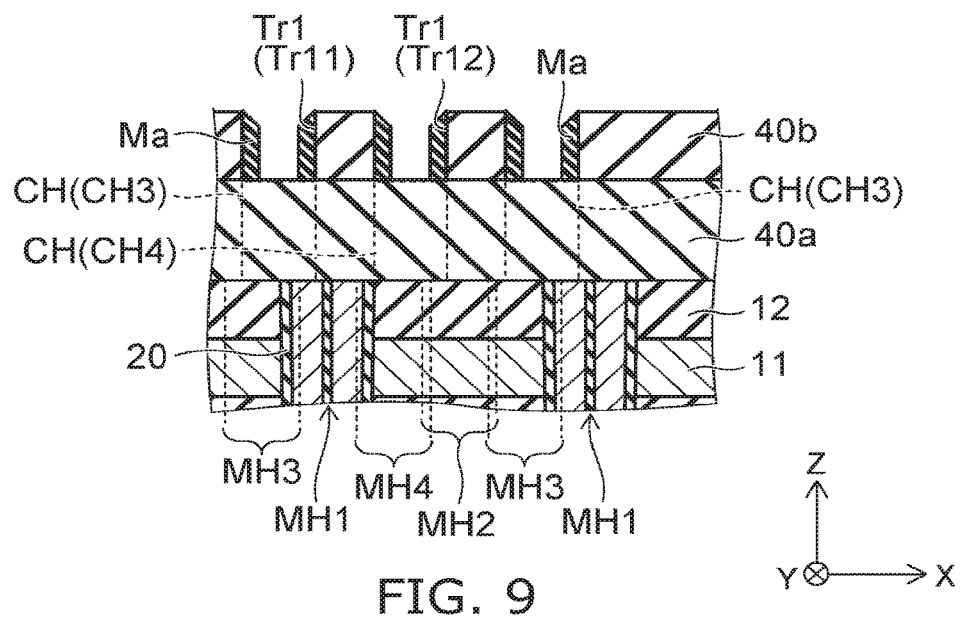

As illustrated in FIG. 9, after depositing insulating material over the whole face, etching is carried out. In this way, the insulating film Ma (first side wall insulating film) is formed on the side wall within the trench Tr1.

Figure 10:
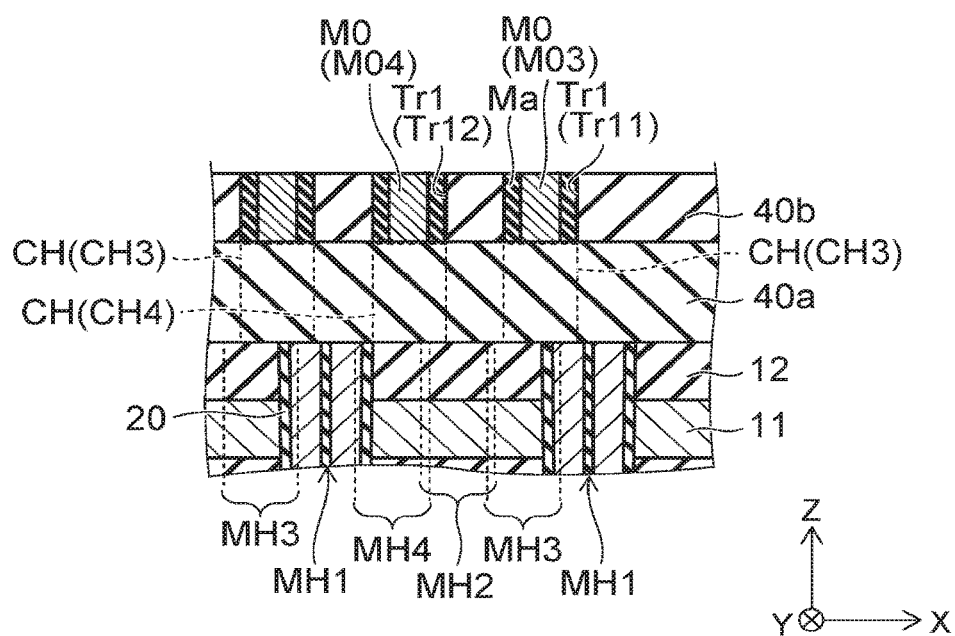

As illustrated in FIG. 10, after depositing a conductive material that includes, for example, tungsten over the whole face, a flattening process such as chemical mechanical polishing (CMP) is carried out. In this way, the lower bit line M0 is formed within the trench Tr1. In other words, the first lower bit line M03 (third interconnection) is formed within the first trench Tr11.

The second lower bit line M04 (fourth line) is formed within the second trench Tr12.

Figure 11:
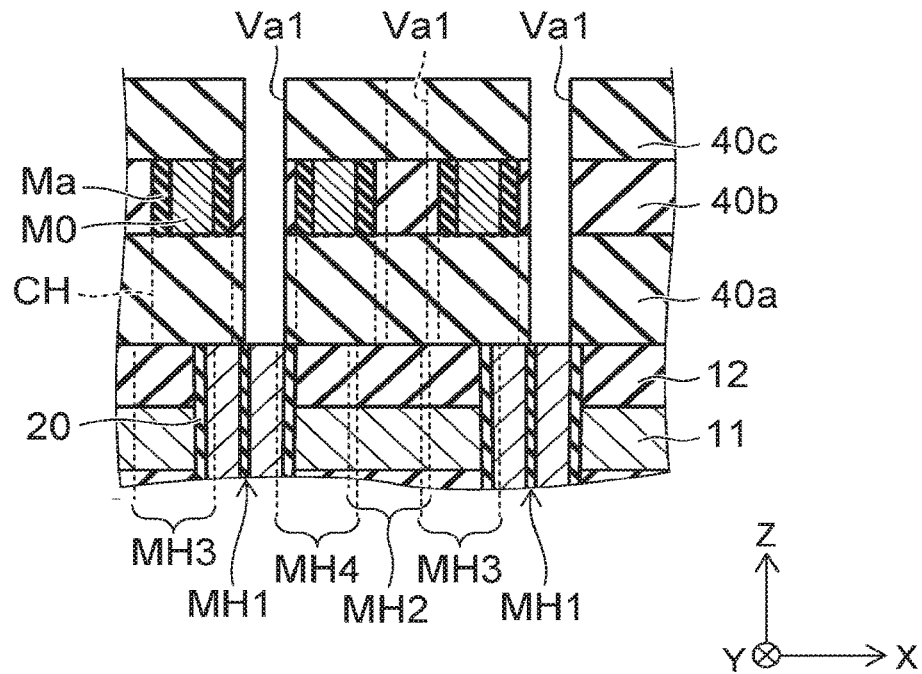

As illustrated in FIG. 11, an insulating film 40c (third insulating film) is formed on the insulating film 40b. A hole Va1 is formed directly above the first pillar MH1 and the second pillar MH2. The hole Va1 passes through the insulating films 40b and 40a. The hole Va1 has, for example, a substantially circular cylindrical shape.

Figure 12:
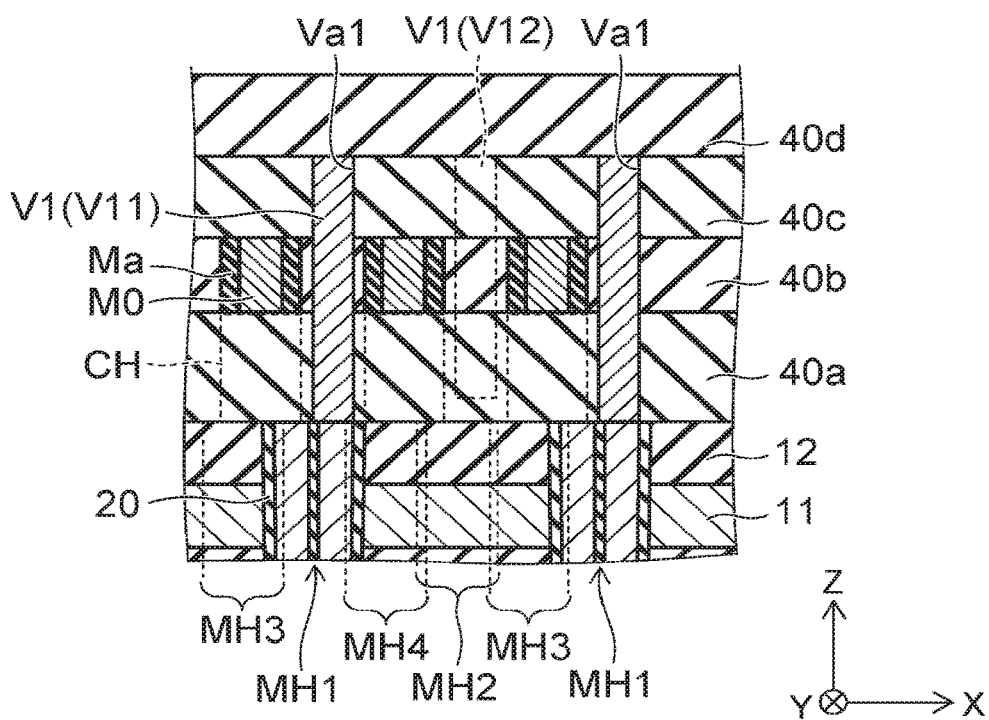

As illustrated in FIG. 12, the plug V1 is formed within the hole Va1. In this way, the first plug V11 (first conductive member) is formed directly above the first pillar MH1. The plug V1 is electrically connected to the first pillar MH1 or the second pillar MH2. An insulating film 40d is formed on the insulating film 40c.

Figure 13:
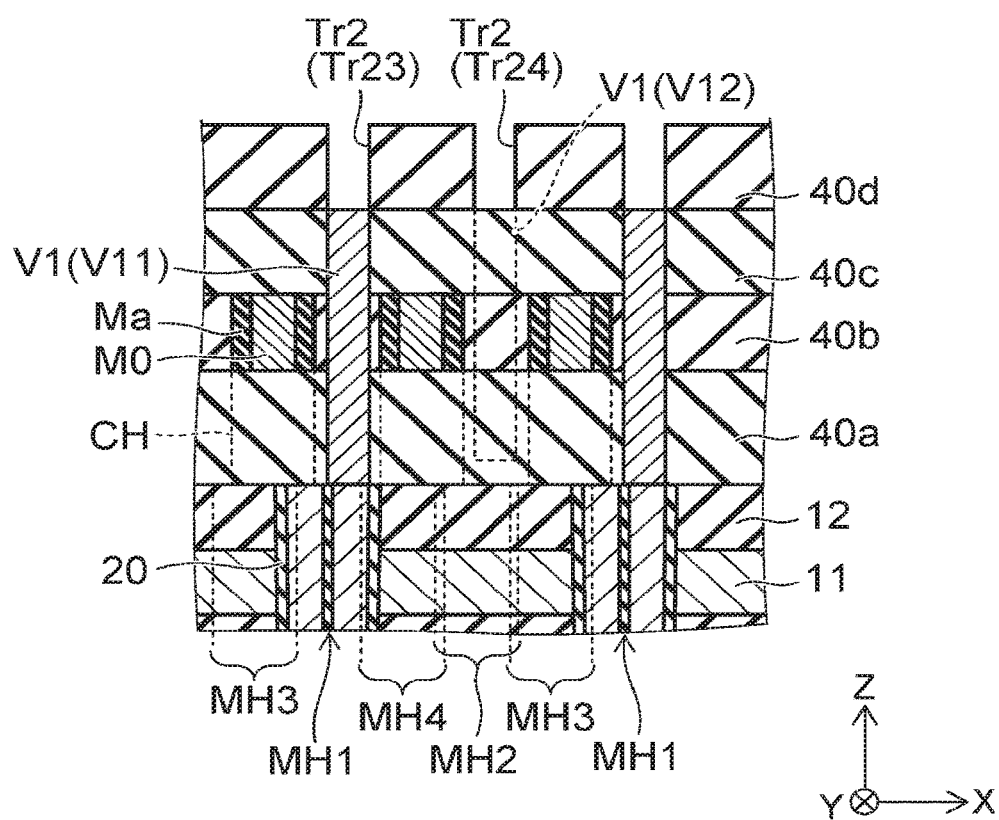

As illustrated in FIG. 13, a trench Tr2 extending in the Y-direction is formed in a region that includes directly above the plug V1 of the insulating film 40d (fourth insulating film). In other words, a third trench Tr23 is formed in a region that includes directly above the first plug V11 of the insulating film 40d. A fourth trench Tr24 is formed in a region that includes directly above the second plug V12 of the insulating film 40d.

Then, as illustrated in FIG. 1A, after depositing insulating material over the whole face, etching is carried out. In this way, an insulating film Mb is formed on the side wall within the trench Tr2. After depositing conductive material over the whole face, a flattening process such as CMP is carried out. In this way, the upper bit line M1 is formed extending in the Y-direction within the trench Tr2. In other words, the first upper bit line (first interconnection) is formed extending in the Y-direction within the third trench Tr23. The second upper bit line (second interconnection) is formed extending in the Y-direction within the fourth trench Tr24.

As a result of the above processes, the semiconductor memory device 10 of the embodiment is manufactured.

In the embodiment, each of the upper bit lines M1 and each of the lower bit lines M0 are provided alternately and separated from each other along the X-direction. The position in the Z-direction of the plurality of upper bits lines M1 is different from the position in the Z-direction of the plurality of lower bit lines M0. Therefore, the distance between the lower bit lines M0 and the distance between the upper bits lines M1 can be increased, while maintaining the size of the semiconductor memory device. In this way, the capacitance of the bit lines of the semiconductor memory device can be reduced.

The minimum value of the distance between holes formed at the same time using an exposure machine used in lithography when forming the holes is determined. In the embodiment, the holes CHa and the holes Va1 are formed in separate processes.

Therefore, the distance in the Y-direction between the holes CHa and the holes Va1 is not subject to the restriction of the exposure machine used in lithography. In other words, as illustrated in FIG. 3, the distance DS1 in the Y-direction between the plug CH and the hole Va1 can be made smaller than the minimum processing dimension of the exposure machine for lithography used in forming the holes.

As a comparative example, there is a side wall process in the method of forming an interconnection pattern (for example appropriately 19.5 nm) in which the inter-wiring space is small, as in bit lines. In accordance with the side wall process, for example the following interconnection patterns are formed. A sacrificial film is formed into a plurality of linear patterns. A slimming process is carried out on the sacrificial film.

A side wall film is formed on the side wall of the sacrificial film. The sacrificial film is removed, leaving the side wall film. In other words, a side wall film is formed having a plurality of linear patterns. A lower layer film is processed using this side wall film or a lithography resist as mask material. As a result of this process, a trench is formed in the lower layer. By providing conductive material within the trench, an interconnection having a small width in the X-direction is formed.

In contrast, in the embodiment, after forming an insulating film (insulating film Mb and/or Mb) on the side wall of the trench (trench Tr1 and/or Tr2), the conductive member is provided within the trench. In this way, bit lines (lower bits lines M0 and/or upper bit lines M1) are formed having a smaller width in the X-direction by the thickness of the insulating film formed on the side wall of the trench. In other words, by not using the side wall process as described above, bit lines can be formed with a small width in the X-direction. Compared with the side wall process as described above, the manufacturing cost can be reduced.

(First Variation of the First Embodiment)

Figure 14:
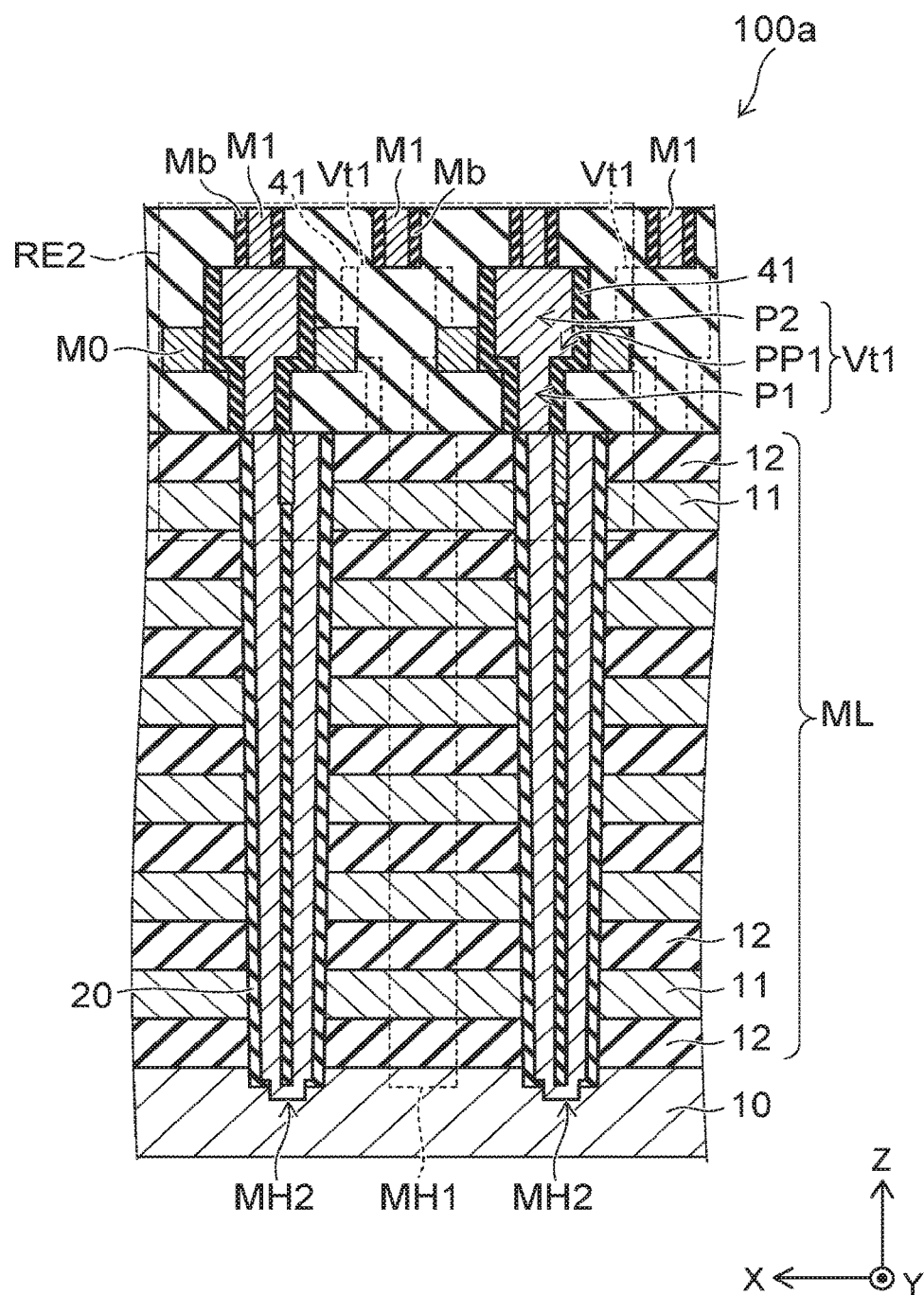
FIG. 14 is a cross-sectional view illustrating a semiconductor memory device according to a first variation of the first embodiment.

FIG. 14 is a cross-sectional view illustrating a semiconductor memory device according to this variation.

Figure 15:
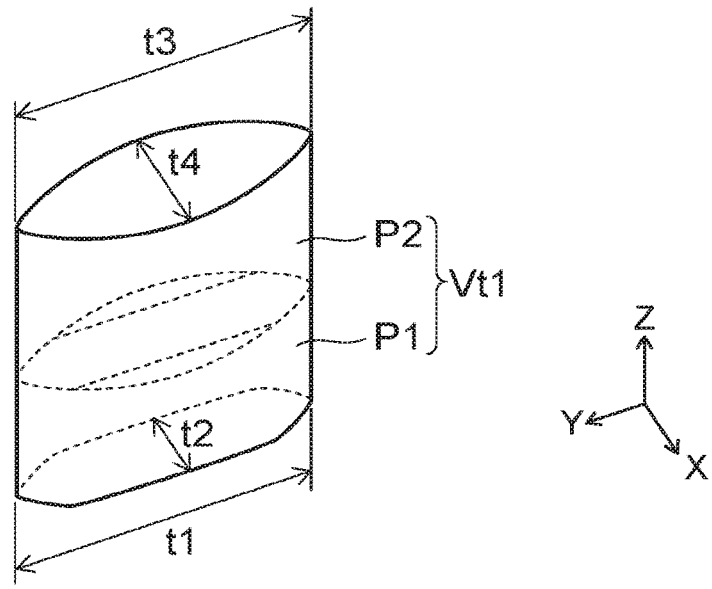
FIG. 15 is a perspective view illustrating a shape of a plug.

FIG. 15 is a perspective view illustrating the shape of a plug.

FIG. 14 is a cross-sectional view taken along line C-C' of FIG. 3.

In a semiconductor memory device 100a of this variation, as illustrated in FIG. 14, a plug Vt1 is provided on both the first pillar MH1 and the second pillar MH2. The plug Vt1 includes a first portion P1, a second portion P2, and a step portion PP1. The first portion P1 is provided between the pillar MH (first pillar MH1 or second pillar MH2) and the upper bit line M1. The second portion P2 is provided between the first portion P1 and the upper bit line M1.

In the X-direction, at least a portion of the second portion P2 overlaps with at least a portion of the lower bit line M0. The step portion PP1 is provided between the first portion P1 and the second portion P2. For example, the step portion PP1 overlaps with at least a portion of the lower bit line M0.

In a direction orthogonal to the Z-direction, an insulating film 41 (third side wall insulating film) is provided between the insulating film 40 and the plug Vt1 and between the lower bit line M0 and the plug Vt1.

As illustrated in FIG. 15, a first length t1 of the first portion P1 in the Y-direction is greater than a second length t2 in the X-direction of the first portion P1. The first length t1 is the length of the portion where the length in the Y-direction of the first portion P1 is the maximum. The second length t2 is the length of the portion where the length in the X-direction of the first portion P1 is the maximum.

A third length t3 of the second portion P2 in the Y-direction is greater than a fourth length t4 in the X-direction of the second portion P2. The third length t3 is the length of the portion where the length in the Y-direction of the second portion P2 is the maximum. The fourth length t4 is the length of the portion where the length in the X-direction of the second portion P2 is the maximum. The fourth length t4 is smaller than the second length t2.

The film corresponding to the insulating film Ma in the first embodiment is not provided in this variation. The rest of the configuration is the same as that of the first embodiment.

The following is a method of manufacturing the semiconductor memory device according to this variation.

FIGS. 16 to 20 are process cross-sectional views illustrating a method of manufacturing the semiconductor device according to this variation.

FIGS. 16 to 20 are cross-sectional views corresponding to the region RE2 illustrated in FIG. 14.

The processes illustrated in FIGS. 4 to 8 are carried out in the same way as for the first embodiment.

Figure 16:
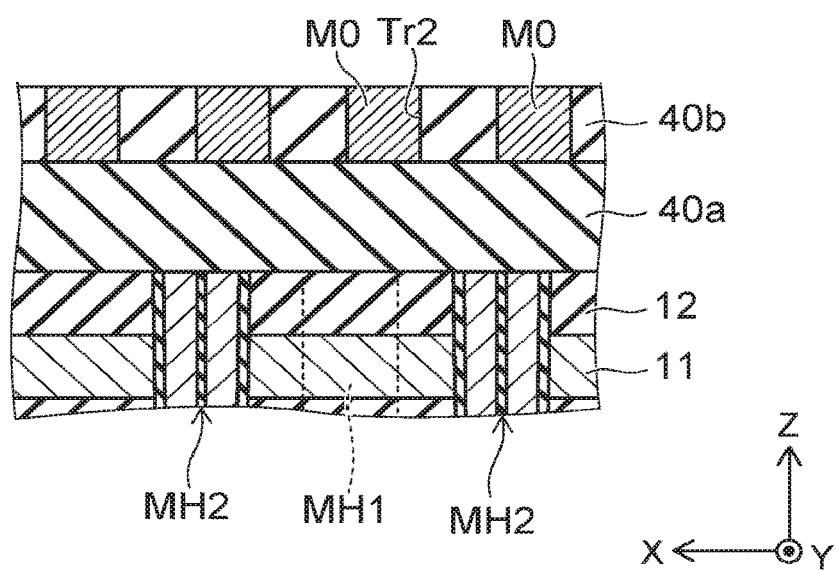
FIGS. 16 to 20 are process cross-sectional views illustrating a method of manufacturing the semiconductor device according to the first variation of the first embodiment.

As illustrated in FIG. 16, conductive material is provided within the trench Tr2. In this way, the lower bit line M0 is formed within the trench Tr2. The lower bit line M0 is formed using material that includes, for example, tungsten.

Figure 17:
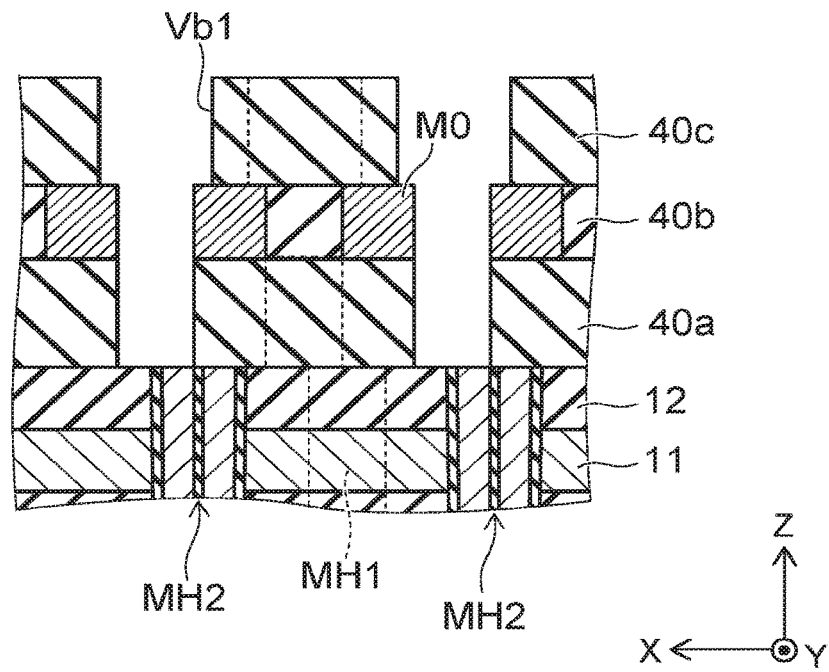

As illustrated in FIG. 17, a hole Vb1 is formed directly above the first pillar MH1 and the second pillar MH2 by anisotropic etching such as RIE. The hole Vb1 passes through the insulating films 40c, 40b, and 40a. At this time, the anisotropic etching is carried out under conditions such that the etching rate of the lower bit lines M0 is less than the etching rate of the insulating films 40a, 40b, 40c.

In the portion of the hole Vb1 passing through the insulating film 40a, the length in the X-direction of the hole Vb1 is formed greater than the distance between the two lower bit lines M0 that are closest to each other in the X-direction. In the portion of the hole Vb1 that passes through the insulating film 40a, the length in the X-direction of the hole Vb1 is formed smaller than the sum of the distance between the two lower bit lines M0 that are closest to each other and the length in the X-direction of one lower bit line M0.

When etching the insulating film 40a, the lower bit line M0 is the etching mask. In this way, the length in the X-direction of the portion of the hole Vb1 that passes through the insulating film 40a is smaller than the length in the X-direction of the portion of the hole Vb1 that passes through the insulating film 40c.

Figure 18:
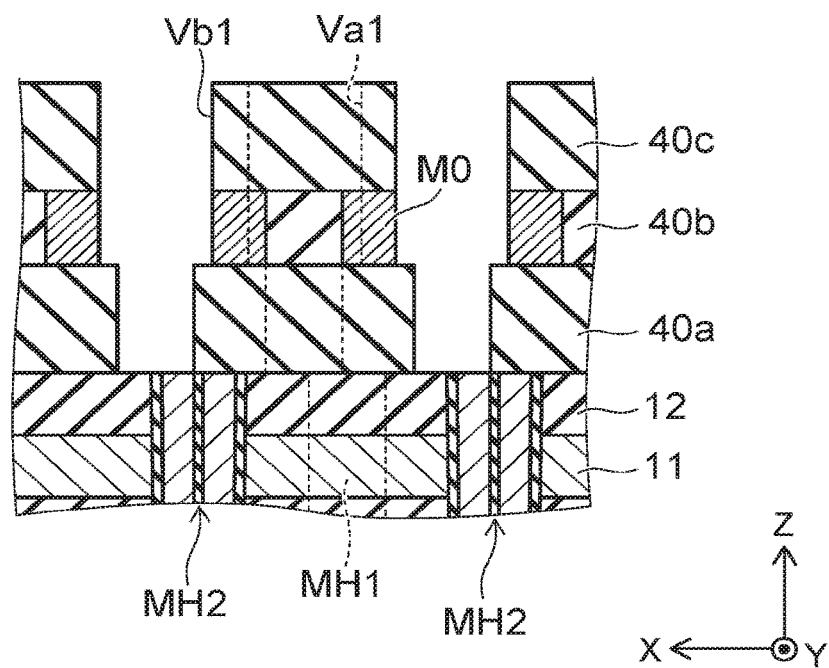

As illustrated in FIG. 18, a portion of the lower bit line M0 is removed by etching using the hole Vb1. At this time, the etching is carried out under conditions such that the etching rate of the lower bit line M0 is greatest. In this way, within the hole Vb1, the distance between two lower bit lines M0 is increased in the X-direction.

Figure 19:
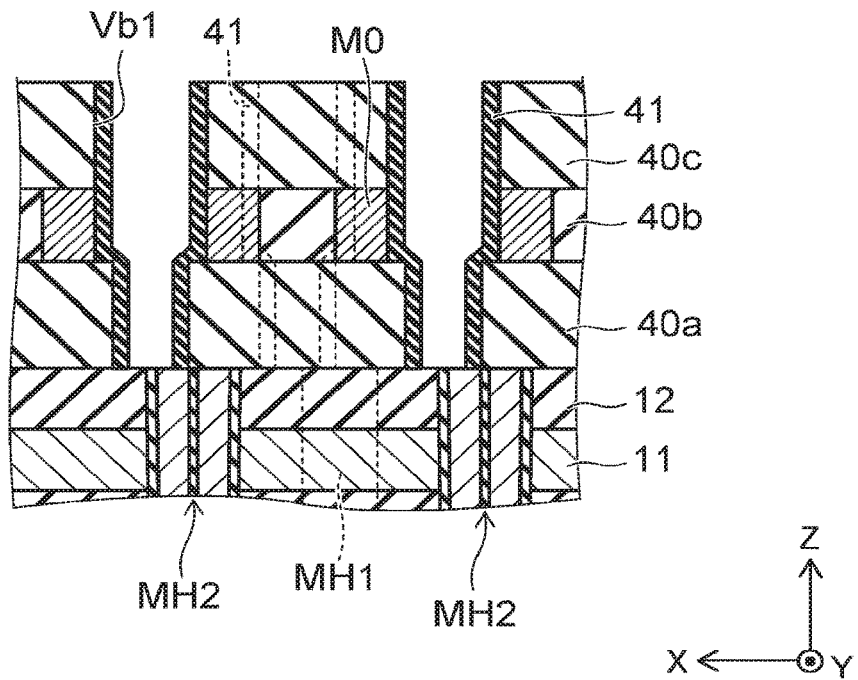

As illustrated in FIG. 19, the insulating film 41 is formed on the side wall of the hole Vb1. The insulating film 41 is formed from, for example, a material that includes silicon oxide.

Figure 20:
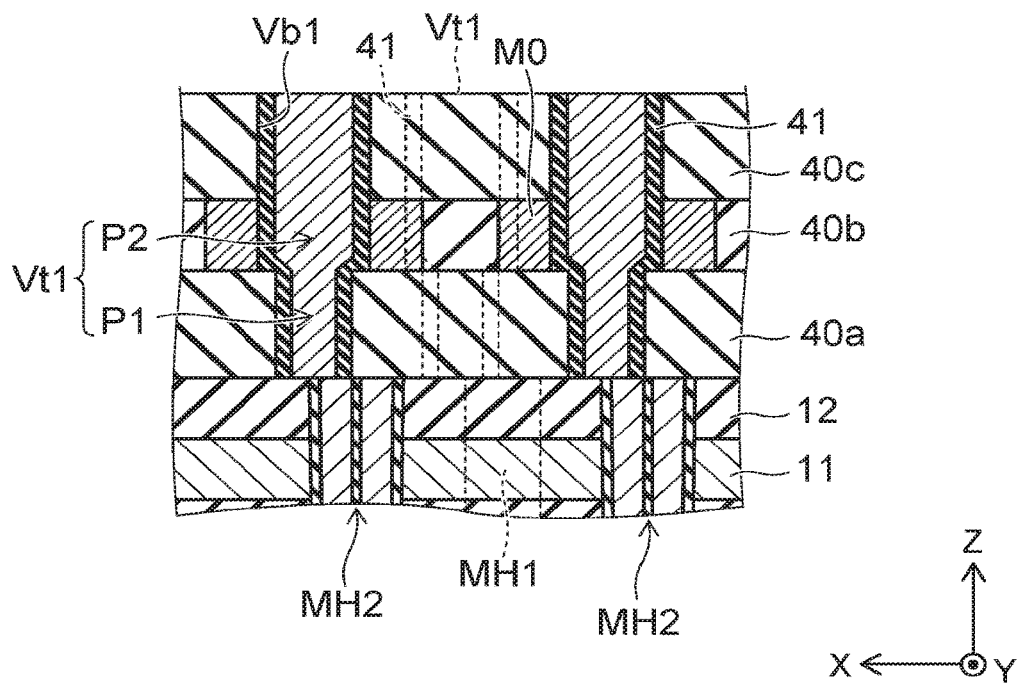

As illustrated in FIG. 20, conductive material is provided within the hole Vb1. In this way, the plug Vt1 is formed within the hole Vb1.

Thereafter, the same processes as for the first embodiment are implemented.

As a result of the above processes, the semiconductor memory device 100a of this variation is manufactured.

In the semiconductor memory device 100a of this variation, the plurality of upper bit lines M1 and the plurality of lower bit lines M0 are provided. In this way, the distance between the bit lines can be increased while maintaining the size of the semiconductor memory device, the same as for the semiconductor memory device 100. Therefore, the capacitance of the bit lines of the semiconductor memory device can be reduced.

The distance DS1 between the hole CH and the hole Va1 can be made smaller than the minimum processing dimension of the exposure machine used when carrying out lithography, the same as for the first embodiment. Also, by not using the side wall process, the upper bit lines M1 can be formed with a small length in the X-direction. It is therefore possible to reduce manufacturing costs.

(Second Variation of the First Embodiment)

Figure 21:
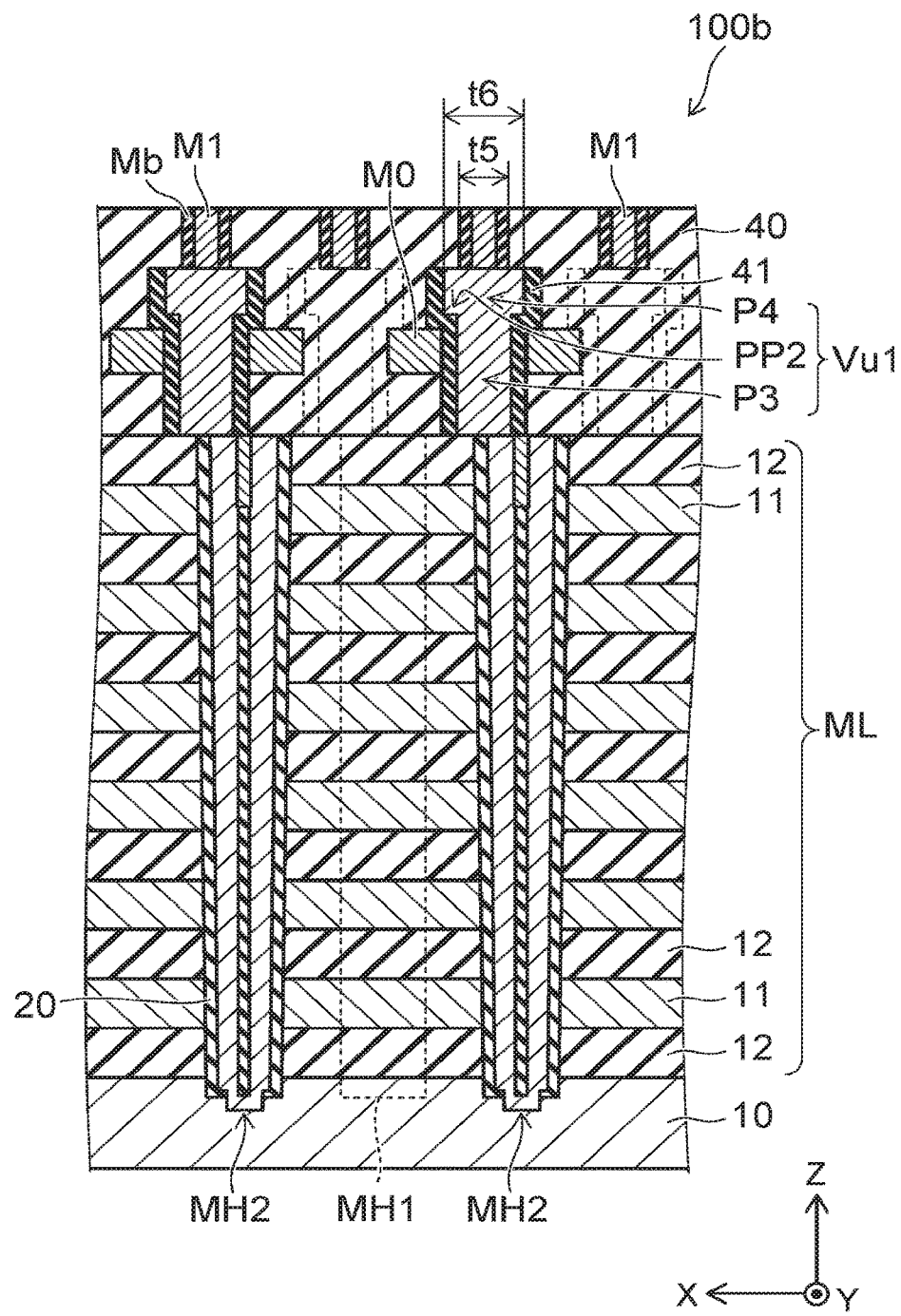
FIG. 21 is a cross-sectional view illustrating a semiconductor memory device according to a second variation of the first embodiment.

FIG. 21 is a cross-sectional view illustrating a semiconductor memory device according to this variation.

FIG. 21 is a cross-sectional view corresponding to the cross-section at line C-C' of FIG. 3.

In a semiconductor memory device 100b of this variation, as illustrated in FIG. 21, a plug Vu1 is provided on both the first pillar MH1 and the second pillar MH2. The plug Vu1 includes a third portion P3, a fourth portion P4, and a step portion PP2. The third portion P3 is provided between the pillar MH (first pillar MH1 or second pillar MH2) and the upper bit line M1. The fourth portion P4 is provided between the third portion P3 and the upper bit line M1. The step portion PP2 is provided between the third portion P3 and the fourth portion P4. In the X-direction, the fourth portion P4 does not overlap with the lower bit line M0. In the X-direction, the step portion PP2 is located on the lower bit line M0.

In the X-direction, at least a portion of the third portion P3 overlaps with at least a portion of the lower bit line M0. The length t5 of the third portion P3 in the X-direction is shorter than the length t6 in the X-direction of the fourth portion P4. The length t5 is the length of the portion where the length in the X-direction of the third portion P3 is the maximum. The length t6 is the length of the portion where the length in the X-direction of the fourth portion P4 is the maximum.

The following is a method of manufacturing the semiconductor memory device 100b according to this variation.

Figure 22:
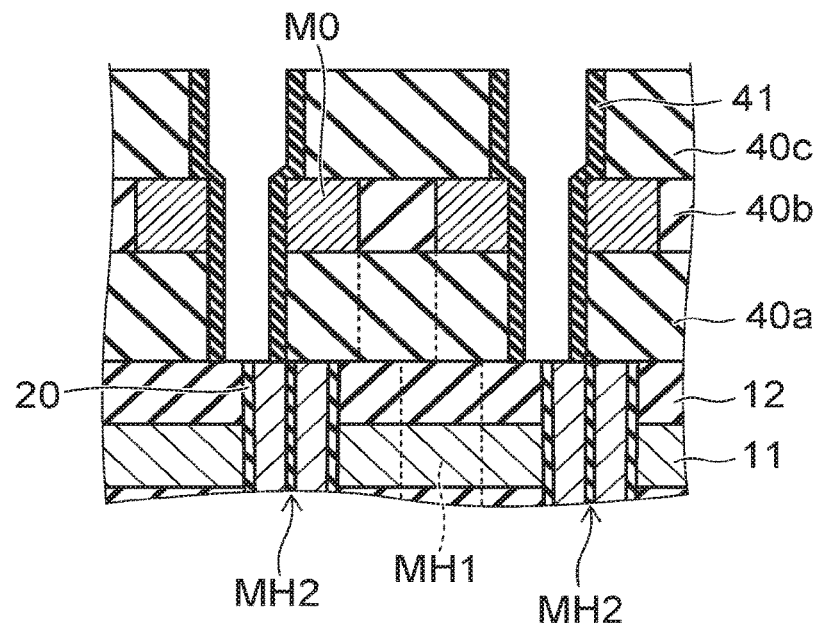
FIGS. 22 and 23 are process cross-sectional views illustrating a method of manufacturing the semiconductor device according to the second variation of the first embodiment.
Figure 23:
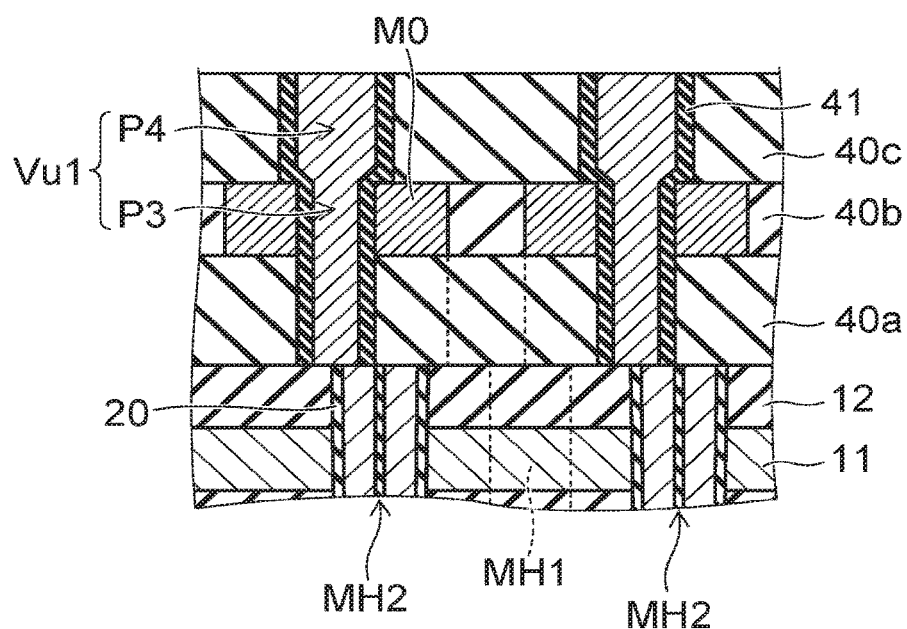

FIGS. 22 and 23 are process cross-sectional views illustrating a method of manufacturing the semiconductor device according to this variation.

FIGS. 22 and 23 are cross-sectional views corresponding to the region RE2 illustrated in FIG. 14.

The processes illustrated in FIGS. 4 to 8 and FIGS. 16 and 17 are carried out in the same way as for the first variation of the first embodiment.

As illustrated in FIG. 22, the insulating film 41 is formed on the side wall of the hole Vb1. In other words, in this variation, a process to carry out etching on the lower bit line M0 using the hole Vb1 is not implemented.

As illustrated in FIG. 23, conductive material is provided within the hole Vb1. In this way, the plug Vu1 is formed. The plug Vu1 is formed using material that includes, for example, tungsten.

Thereafter, the same processes as for the first variation of the first embodiment are implemented.

As a result of the above processes, the semiconductor memory device 100b of this variation is manufactured.

Unlike the first variation of the first embodiment, etching of the lower bit line M0 is not carried out using the hole Vb1. In this way, the manufacturing process can be further reduced.

(Second Embodiment)

Figure 24:
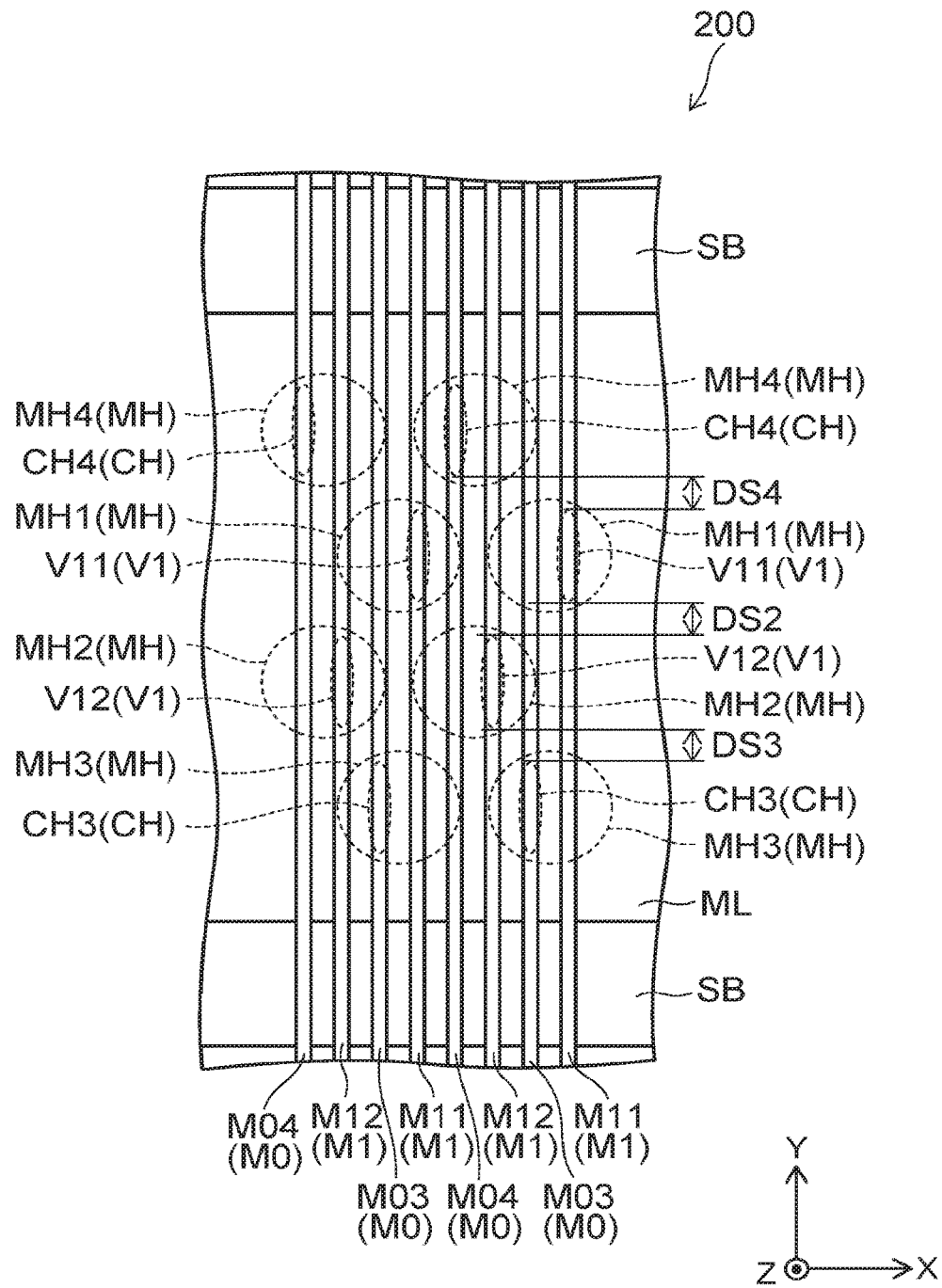
FIG. 24 is a plan view illustrating a semiconductor memory device according to the second embodiment.

FIG. 24 is a plan view illustrating a semiconductor memory device according to the embodiment.

In a semiconductor memory device 200, the arrangement of the first to fourth pillars MH1 to MH4, and the first to fourth plugs V11, V12, CH3, and CH4 differs from that of the semiconductor memory device 100.

The configuration elements of the semiconductor memory device 200 are the same as those of the semiconductor memory device 100.

As illustrated in FIG. 24, the pillars MH are disposed staggered. Between a row of a plurality of pillars MH disposed in the X-direction and an adjacent row, the positions of the pillars MH are shifted relative to each other in the X-direction. Note that in FIG. 24, configuration elements apart from the pillars MH, the stacked body ML, the upper bit lines M1, the lower bit lines M0, and the plugs V1 are omitted.

The plurality of pillars MH is disposed in four rows in the Y-direction, between two source members SB that are adjacent to each other in the Y-direction. In the Y-direction, the first row of pillars ME disposed along the X-direction is referred to as the third pillars MH3, the second row of pillars MH disposed along the X-direction is referred to as the first pillars MH1, the third row of pillars ME disposed along the X-direction is referred to as the second pillars MH2, and the fourth row of pillars MH disposed along the X-direction is referred to as the fourth pillars MH4.

The first upper bit line M11 and the first pillar MH1 are electrically connected via the first plug V11 (first conductive member).

The second upper bit line M12 and the second pillar MH2 are electrically connected via the second plug V12 (second conductive member).

The first lower bit line M03 and the third pillar MH3 are electrically connected via the third plug CH3 (third conductive member).

The second lower bit line M04 and the fourth pillar MH4 are electrically connected via the fourth plug CH4 (fourth conductive member).

In the embodiment, as illustrated in FIG. 24, the distances DS3 and DS4 between the plug CH and the plug V1 can be made shorter than the minimum value of the exposure machine used for lithography for forming the plugs. The holes CHa and the holes Va1 are formed in separate processes, the same as for the first embodiment. Therefore, the distance in the Y-direction between the holes CHa and the holes Va1 are not subject to the restriction of the exposure machine used in lithography. In the embodiment, as illustrated in FIG. 24, the distances DS3 and DS4 in the Y-direction between the plug CH and the plug V1 can be made smaller than the minimum processing dimension of the exposure machine for lithography used in forming the holes. Therefore in the embodiment, the distances between the first plug V11 and the fourth plug CH4 and between the second plug V12 and the third plug CH3 can be made smaller than the minimum processing dimension of the exposure machine for lithography.

(Third Embodiment)

Figure 25:
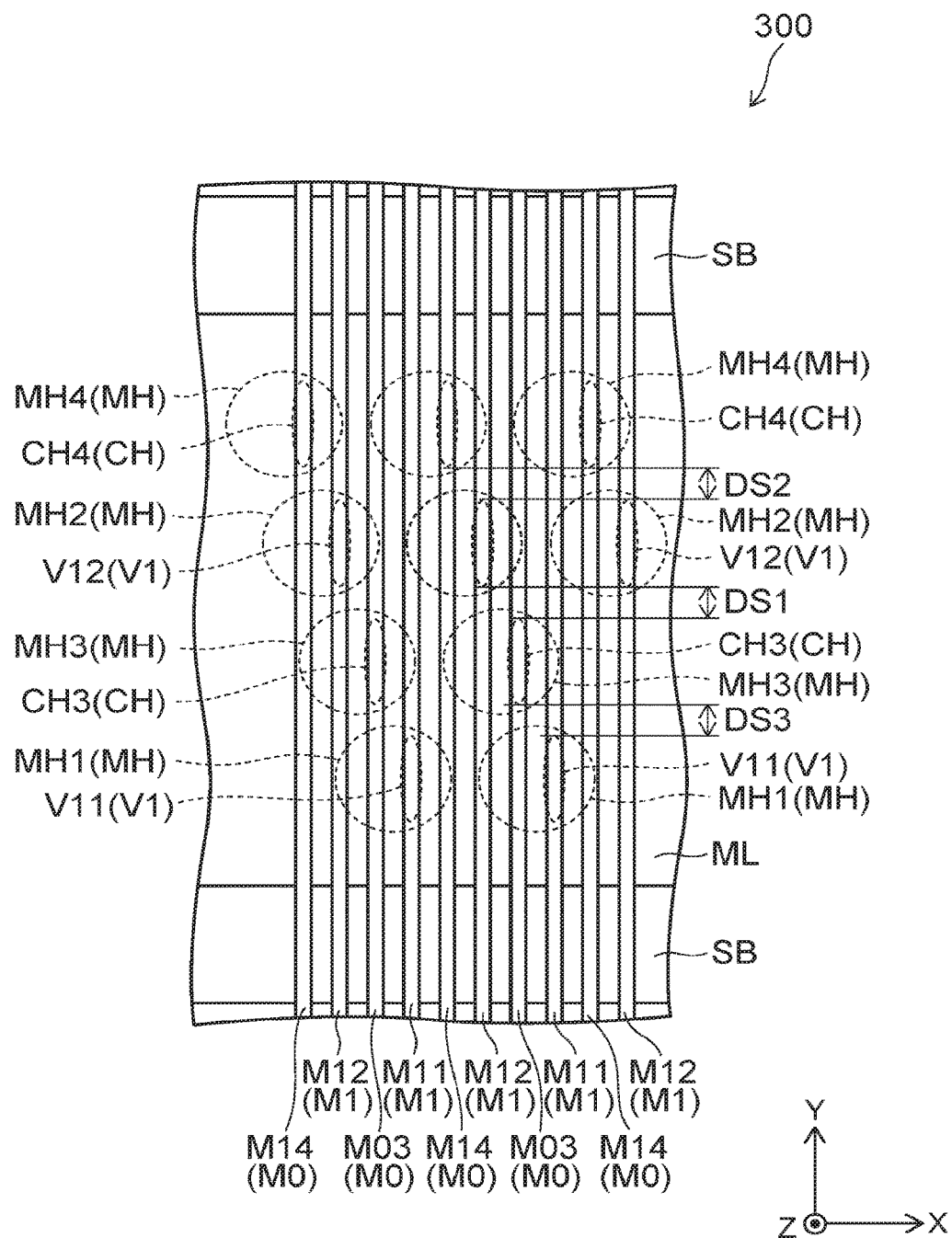
FIG. 25 is a plan view illustrating a semiconductor memory device according to the second embodiment.

FIG. 25 is a plan view illustrating a semiconductor memory device according to the embodiment.

The configuration elements of a semiconductor memory device 300 according to the embodiment are the same as those of the semiconductor memory device 100.

In the semiconductor memory device 300, the arrangement of the first to fourth pillars MH1 to MH4, and the first to fourth plugs V11, V12, CH3, and CH4 differs from that of the semiconductor memory device 100.

As illustrated in FIG. 25, the plurality of pillars MH are disposed, for example, in four rows in the Y-direction, between two source members SB that are adjacent to each other in the X-direction. Between a row of a plurality of pillars MH disposed in the X-direction and another row of a plurality of pillars MH disposed in the X-direction, the positions of the pillars MH are shifted relative to each other in the X-direction. In the Y-direction, the first row of pillars MH disposed along the X-direction is referred to as the first pillars MH1, the second row of pillars MH disposed along the X-direction is referred to as the third pillars MH3, the third row of pillars MH disposed along the X-direction is referred to as the second pillars MH2, and the fourth row of pillars MH disposed along the X-direction is referred to as the fourth pillars MH4. In FIG. 25, configuration elements apart from the pillars MH, the stacked body ML, the upper bit lines M1, the lower bit lines M0, and the plugs V1 are omitted.

The first upper bit line M11 and the first pillar MH1 are electrically connected via the first plug V11 (first conductive member).

The second upper bit line M12 and the second pillar MH2 are electrically connected via the second plug V12 (second conductive member).

The first lower bit line M03 and the third pillar MH3 are electrically connected via the third plug CH3 (third conductive member).

The second lower bit line M04 and the fourth pillar MH4 are electrically connected via the fourth plug CH4 (fourth conductive member).

In the embodiment, as illustrated in FIG. 25, the distance between the plug CH and the plug V1 that are adjacent to each other in the Y-direction is not restricted by the exposure machine used in lithography. In other words, as illustrated in FIG. 25, the distances DS1, DS2, and DS3 between the plug CH and the plug V1 can be made shorter than the minimum value of the exposure machine used for lithography for forming the plugs.

According to the embodiments as described above, it is possible to realize a semiconductor memory device and manufacturing method for same with reduced area occupied by capacitative elements.

What is claimed is:

1. A semiconductor memory device comprising:
a structural body including a plurality of electrode layers arranged in a first direction;
a first pillar, a second pillar, a third pillar, and a fourth pillar provided in the structural body, the first to fourth pillars extending along the first direction in the structural body;
a plurality of charge storage films provided between the first pillar and the electrode layers, between the second pillar and the electrode layers, between the third pillar and the electrode layers, and between the fourth pillar and the electrode layers;
a first interconnection extending in a second direction and electrically connected to the first pillar, the second direction crossing the first direction, a length of the first interconnection in the second direction being greater than a length of the first interconnection in the first direction;
a second interconnection extending in the second direction and electrically connected to the second pillar, a length of the second interconnection in the second direction being greater than a length of the second interconnection in the first direction;
a third interconnection extending in the second direction and electrically connected to the third pillar, a length of the third interconnection in the second direction being greater than a length of the third interconnection in the first direction; and
a fourth interconnection extending in the second direction and electrically connected to the fourth pillar, a length of the fourth interconnection in the second direction being greater than a length of the fourth interconnection in the first direction,
a first distance between the first pillar and the first interconnection in the first direction being greater than a second distance between the third pillar and the third interconnection in the first direction, and the first distance being greater than a third distance between the fourth pillar and the fourth interconnection in the first direction, and
a fourth distance between the second pillar and the second interconnection in the first direction being greater than the second distance, the fourth distance being greater than the third distance.

2. The device according to claim 1, wherein
the second interconnection is disposed between the first interconnection and the fourth interconnection upon viewed from the first direction, and
the third interconnection is disposed between the first interconnection and the second interconnection upon viewed from the first direction.

3. The device according to claim 1, wherein
at least a portion of the first interconnection overlaps at least a portion of the second interconnection in a third direction, the third direction crossing the first direction and the second direction, and
at least a portion of the third interconnection overlaps with at least a portion of the fourth interconnection in the third direction.

4. The device according to claim 1, further comprising:
a first conductive member provided between the first pillar and the first interconnection, the first conductive member electrically connecting the first pillar to the first interconnection;
a second conductive member provided between the second pillar and the second interconnection, the second conductive member electrically connecting the second pillar to the second interconnection;
a third conductive member provided between the third pillar and the third interconnection, the third conductive member electrically connecting the third pillar to the third interconnection; and
a fourth conductive member provided between the fourth pillar and the fourth interconnection, the fourth conductive member electrically connecting the fourth pillar to the fourth interconnection;
wherein a length of the first conductive member in the first direction is longer than a length of the third conductive member in the first direction,
the length of the first conductive member is longer than a length of the fourth conductive member in the first direction,
a length of the second conductive member in the first direction is longer than the length of the third conductive member in the first direction, and
the length of the second conductive member is longer than the length of the fourth conductive member in the first direction.

5. The device according to claim 2, wherein
the second pillar is disposed between the first pillar and the fourth pillar upon being viewed from the first direction, and
the third pillar is disposed between the second pillar and the fourth pillar upon being viewed from the first direction.

6. The device according to claim 2, wherein
the first pillar is disposed between the third pillar and the fourth pillar upon being viewed from the first direction, and
the second pillar is disposed between the first pillar and the third pillar upon being viewed from the first direction.

7. The device according to claim 2, wherein
the second pillar is disposed between the first pillar and the fourth pillar upon being viewed from the first direction, and
the third pillar is disposed between the first pillar and the second pillar upon being viewed from the first direction.

8. The device according to claim 4, wherein the first conductive member includes:
a first portion;
a second portion provided on the first portion; and
a step portion provided between the first portion and the second portion, wherein a first length of the first portion in the second direction is greater than a second length of the first portion in a third direction crossing the first direction and the second direction,
a third length of the second portion in the second direction is greater than a fourth length of the second portion in the third direction, and
a second length of the first portion in the third direction is greater than the fourth length of the second portion in the third direction.

9. The device according to claim 8, wherein at least a portion of the second portion overlaps with at least a portion of the third interconnection and at least a portion of the fourth interconnection in the third direction.

10. The device according to claim 8, wherein the step portion is provided between the third interconnection and the fourth interconnection in the first direction.

11. The device according to claim 8, wherein the step portion is provided on the third interconnection and on the fourth interconnection.

12. The device according to claim 8, wherein in the third direction crossing the first direction and the second direction, the second portion does not overlap the third interconnection and the fourth interconnection.

13. A method for manufacturing a semiconductor memory device, the method comprising:
forming a structural body that includes a plurality of first layers disposed in a first direction;
forming a first memory hole, a second memory hole, a third memory hole, and a fourth memory hole in the structural body, the first to fourth memory holes extending along the first direction;
forming a plurality of charge storage films on side walls of the first to fourth memory holes;
forming first to fourth pillars in the first to fourth memory holes respectively;
forming a first insulating film on the structural body;
forming a third conductive member in a region of the first insulating film above the third pillar, and forming a fourth conductive member in a region of the first insulating film above the fourth pillar;
forming a second insulating film on the first insulating film, the third conductive member, and the fourth conductive member;
forming in the second insulating film, a first groove extending in a second direction crossing the first direction, and a second groove extending in the second direction, the first groove including a portion on the third conductive member, the second groove including a portion on the fourth conductive member, a length of the first groove in the second direction being greater than a length of the first groove in the first direction, and a length of the second groove in the second direction being greater than a length of the second groove in the first direction;
forming a third interconnection within the first groove, and forming a fourth interconnection within the second groove;
forming a third insulating film on the second insulating film, the third interconnection, and the fourth interconnection;
forming within the third insulating film, a first conductive member directly above the first pillar, and a second conductive member directly above the second pillar;
forming a fourth insulating film on the third insulating film, the first conductive member, and the second conductive member;

forming a third groove extending in the second direction in a portion that includes a region of the fourth insulating film directly above the first conductive member, and forming a fourth groove extending in the second direction in a portion that includes a region of the fourth insulating film directly above the second conductive member, a length of the third groove in the second direction being greater than a length of the third groove in the first direction, and a length of the fourth groove in the second direction being greater than a length of the fourth groove in the first direction; and forming a first interconnection within the third groove, and forming a second interconnection within the fourth groove.

14. The method according to claim 13, further comprising forming a first side wall insulating film on a side wall of the first groove and on a side wall of the second groove, after forming the first groove and the second groove, and before forming the third interconnection and the fourth interconnection.

15. The method according to claim 13, further comprising forming a second side wall insulating film on a side wall of the third groove and on a side wall of the fourth groove, after forming the third groove and the fourth groove, and before forming the first interconnection and the second interconnection.

16. The method according to claim 13, wherein forming the first conductive member and the second conductive member includes:

forming holes above the first pillar and on the second pillar;

forming a third side wall insulating film on a side wall of the hole; and providing conductive material within the holes.

17. The method according to claim 16, wherein forming the first conductive member and the second conductive member further includes:

etching a portion of the third interconnection and a portion of the fourth interconnection using the holes, after forming the holes, and before forming the third side wall insulating film.

* * * * *